(12) United States Patent
Yamagishi

(10) Patent No.: US 7,521,743 B2
(45) Date of Patent: Apr. 21, 2009

(54) NONVOLATILE MAGNETIC MEMORY DEVICE AND PHOTOMASK

(75) Inventor: Hajime Yamagishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 601 days.

(21) Appl. No.: 11/148,397

(22) Filed: Jun. 8, 2005

(65) Prior Publication Data

US 2005/0276090 A1    Dec. 15, 2005

(30) Foreign Application Priority Data

Jun. 10, 2004   (JP)   ............... P2004-172122

(51) Int. Cl.
*H01L 31/113*   (2006.01)
(52) U.S. Cl. .................. 257/295; 257/298; 257/421; 257/E21.662; 257/E21.663; 365/158; 365/65; 365/97; 365/171; 365/173
(58) Field of Classification Search ............... 257/225, 257/421, E27.104, E21.662, E21.663, E21.665, 257/295, 298, 390, 314; 365/158, 65, 66, 365/97, 171, 173
See application file for complete search history.

(56) References Cited

U.S. PATENT DOCUMENTS 6,949,779 B2 *   9/2005   Kai et al. ............... 257/295
6,956,270 B2 *  10/2005   Fukuzumi ............... 257/421

* cited by examiner

*Primary Examiner*—Phuc T Dang
*Assistant Examiner*—Thanh Y Tran
(74) *Attorney, Agent, or Firm*—Sonnenschein Nath & Rosenthal LLP

(57) ABSTRACT

Disclosed is a nonvolatile magnetic memory device including a magntoresistance device having a recording layer formed of a ferromagnetic material for storing information by use of variation in resistance depending on the magnetization inversion state. The plan-view shape of the recording layer includes a pseudo-rhombic shape having four sides, at least two of the four sides each include a smooth curve having a central portion curved toward the center of the pseudo-rhombic shape. The easy axis of magnetization of the recording layer is substantially parallel to the longer axis of the pseudo-rhombic shape. The hard axis of magnetization of the recording layer is substantially parallel to the shorter axis of the pseudo-rhombic shape. The sides constituting the plan-view shape of the recording layer are smoothly connected to each other.

5 Claims, 22 Drawing Sheets

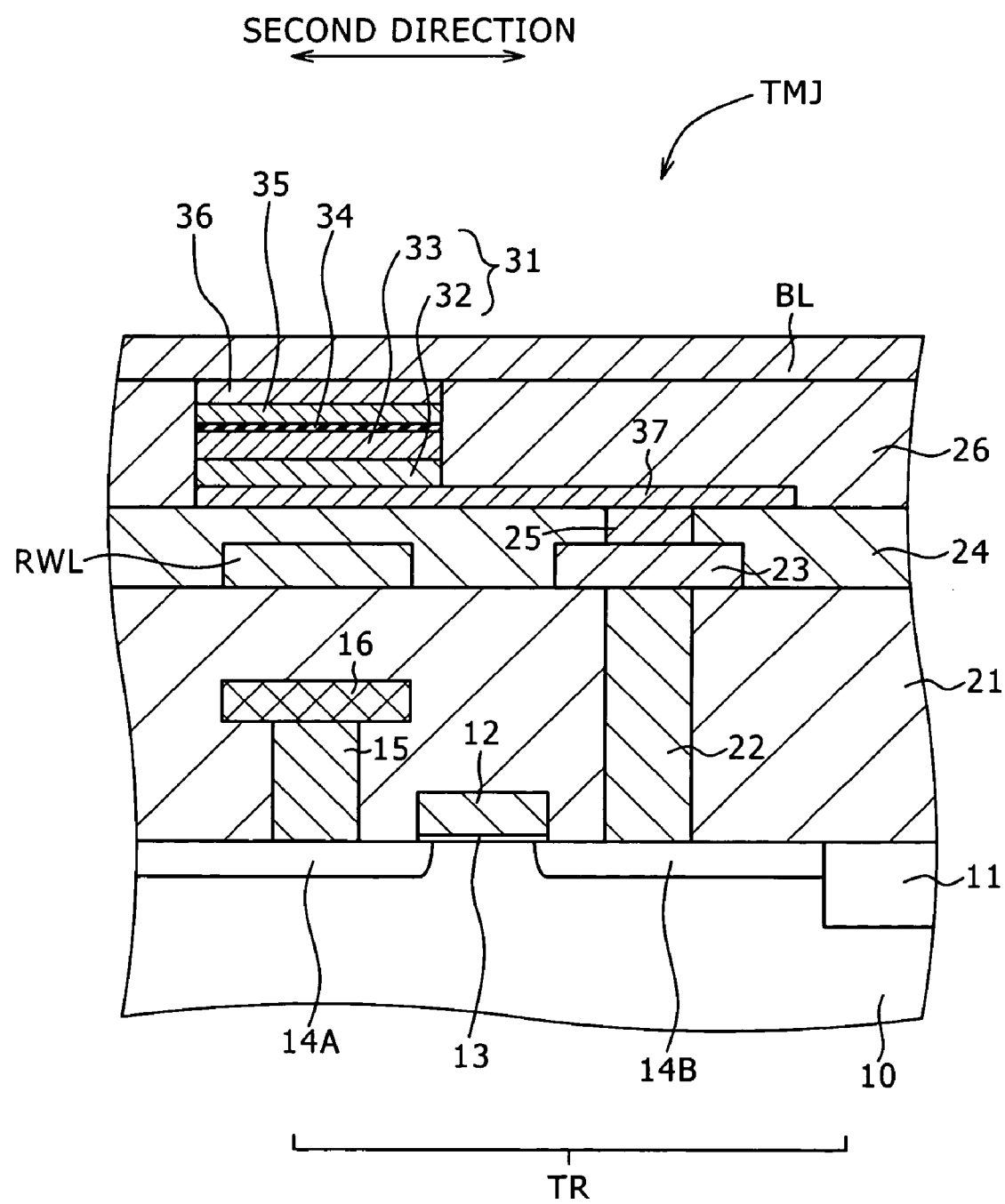

[RECTANGLE]

[ELLIPSE]

[POLYGON]

[RHOMBUS]

[PARALLELOGRAM]

[TRAPEZOID]

NONVOLATILE MAGNETIC MEMORY DEVICE AND PHOTOMASK

BACKGROUND OF THE INVENTION

The present invention relates to a nonvolatile magnetic memory device, and a photomask for use in the manufacture of the nonvolatile magnetic memory device.

Attendant on the drastic spread of personal small apparatuses such as communication apparatuses, particularly, the personal digital assistants, various semiconductor devices such as memories and logical circuits constituting the apparatuses are desired to have higher performance, such as higher degree of integration, higher operating speed, lower power consumption, etc. Particularly, nonvolatile memories are considered to be keenly desired in the ubiquitous computing age. Even in the cases of consumption or trouble in the power supply or in the cases of cutoff between a server and a network due to some disorder, the nonvolatile memory makes it possible to preserve and protect important information. In addition, while the recent portable apparatuses are designed to suppress power consumption as much as possible by putting unnecessary circuit blocks into the stand-by state, if a nonvolatile memory capable of functioning as both a high-speed work memory and a large-capacity storage memory can be realized, it is possible to eliminate the wastefulness in power consumption and memory. Besides, the "instant-ON" function enabling an instantaneous start upon making the power supply can also become possible if a high-speed large-capacity nonvolatile memory can be realized.

Examples of the nonvolatile memory include flash memories using semiconductor materials, and ferroelectric nonvolatile semiconductor memories (FERAMs, Ferroelectric Random Access Memories) using ferroelectric materials. However, the flash memories have the defects that the write speed is on the order of microseconds, which is lower than desired. On the other hand, the FERAM has a number of times of overwriting possible on the order of $10^{12}$ to $10^{14}$, which is too low for the FERAM to be used in place of SRAM or DRAM, and there is the problem that micro-processing of the ferroelectric material layer is difficult to carry out.

As a nonvolatile memory free of the above-mentioned defects, the nonvolatile magnetic memory devices called MRAM (Magnetic Random Access Memory) has come to be paid attention to. The MRAM in the early stage has been based on a spin valve using the GMR (Giant Magnetoresistance) effect. However, the early MRAM has the drawback that, since the memory cell resistance of the load is as low as 10 to 100 $\Omega$, the power consumption per bit at the time of reading is large, and it is difficult to increase the capacity.

On the other hand, the MRAM using the TMR (Tunnel Magnetoresistance) effect has come to be paid attention to in recent years, since the resistance variation ratio at room temperature has been improved to about 20%, from the values of about 1 to 2% in the beginning stage of development. The TMR type MRAM is simple in structure, promises easy scaling, and has a large number of times of overwriting possible because of the recording by rotation of the magnetic moment. Furthermore, with the TMR type MRAM, a very short access time is expected, and it is said that the TMR type MRAM has already come to be able to operate at a rate of 100 MHz.

A schematic, partly sectional view of the TMR type MRAM (hereinafter referred to simply as MRAM) is shown in FIG. 6. The MRAM includes a tunnel magnetoresistance device TMJ connected to a selection transistor TR including a MOSFET.

The tunnel magnetoresistance device TMJ has a laminate structure of a first ferromagnetic material layer 31, a tunnel insulation film 34, and a second ferromagnetic material layer 35. More specifically, the first ferromagnetic material layer 31 has a two-layer structure of, for example, an antiferromagnetic material layer 32 and a ferromagnetic material layer (also called the anchor layer or magnetization fixation layer) 33, in this order from the lower side, and has a strong unidirectional magnetic anisotropy due to the exchange interaction between the two layers. The second ferromagnetic material layer 35 whose magnetization direction can be rotated comparatively easily is also called a free layer or a recording layer. Incidentally, the second ferromagnetic material layer may be called the recording layer 35 in the following description. The tunnel insulation film 34 plays the roles of interrupting the magnetic coupling between the recording layer 35 and the magnetization fixation layer 33 and of passing a tunnel current. A bit line BL for connection between the MRAMs is formed on an upper interlayer insulation layer 26. A top coat film 36 provided between the bit line BL and the recording layer 35 functions to prevent mutual diffusion between the atoms constituting the bit line BL and the atoms constituting the recording layer 35, to reduce the contact resistance, and to prevent the oxidation of the recording layer 35. In the figure, the reference numeral 37 denotes an extraction electrode connected to the lower surface of the antiferromagnetic material layer 32.

Further, a write word line RWL is disposed on the lower side of the tunnel magnetoresistance device TMJ, with a lower interlayer insulation layer 24 therebetween. Incidentally, the extension direction of the write word line RWL (first direction) and the extension direction of the bit line BL (second direction) are ordinarily orthogonal to each other.

On the other hand, the selection transistor TR is formed at a portion of a silicon semiconductor substrate 10 surrounded by a device isolation region 11, and is covered with an interlayer insulation layer 21. A source/drain region 14B on one side is connected to an extraction electrode 37 for the tunnel magnetoresistance device TMJ through a contact hole 22 including a tungsten plug, a landing pad portion 23, and a contact hole 25 including a tungsten plug. A source/drain region 14A on the other side is connected to a sense line 16 through a tungsten plug 15. In the figure, reference numeral 12 denotes a gate electrode, and reference numeral 13 denotes a gate insulation film.

In the MRAM array, the MRAM is arranged at each of the intersections (overlapping regions) in the lattice composed of the bit lines BL and the write word lines RWL.

In writing data into the MRAM configured as above, a current in the positive or negative direction is passed through the bit line BL, while a current in a fixed direction is passed through the write word line RWL, and the composite magnetic field thus generated changes the magnetization direction of the second ferromagnetic material layer (recording layer 35), whereby "1" or "0" is recorded in the second ferromagnetic material layer (recording layer 35).

On the other hand, reading of data is conducted by setting the selection transistor TR into the ON state, passing a current through the bit line BL, and detecting via the sense line 16 the change in the tunnel current due to the magnetoresistance effect. Where the magnetization directions of the recording layer 35 and the magnetization fixation layer 33 are equal, a low resistance result is obtained (this state is made to be "0", for example), and where the magnetization directions of the recording layer 35 and the magnetization fixation layer 33 are anti-parallel, a high resistance result is obtained (this state is made to be "1", for example).

In reading the data, suppression of the dispersion in the resistance of the recording layer 35 by maximizing the uniformity of the areas (projection areas) of the tunnel magnetoresistance devices TMJs leads to a reduction in the data reading dispersion, whereby the yield of manufacture is enhanced. One example of the distribution of resistance of the recording layer 35 is shown in FIG. 19. By making the resistance variation ratio as uniform as possible and suppressing the variance width (dispersion) of resistance, it is possible to obtain a larger operation margin of the MRAM and to achieve a higher yield of manufacture. In other words, for the same operation margin on a design basis, it is possible to obtain a larger signal voltage and a higher-speed operation.

On the other hand, in writing the data, suppression of the variance width (dispersion) of the switching magnetic fields ($H_{Switch}$) of the tunnel magnetoresistance devices TMJs may be indispensable for obtaining a large-capacity memory.

FIG. 20 shows an asteroid curve of MRAM disclosed in U.S. Pat. No. 6,081,445. Currents are passed through the bit line BL and the write word line RWL, and, based on the composite magnetic field thus generated, data is written into the tunnel magnetoresistance device TMJ constituting the MRAM. The write current flowing through the bit line BL forms a magnetic field ($H_{EA}$) in the easy axis of magnetization of the recording layer 35, and the current flowing through the write word line RWL forms a magnetic field ($H_{HA}$) in the hard axis of magnetization of the recording layer 35. Depending on the configuration of the MRAM, there may be the cases where the write current flowing through the bit line BL forms the magnetic field ($H_{HA}$) in the hard axis of the recording layer 35, and the current flowing through the write word line RWL forms the magnetic field ($H_{EA}$) in the easy axis of the recording layer 35.

The asteroid curve shows a threshold for inversion of magnetization direction of the recording layer 35 due to the composite magnetic field (composition of magnetic field vectors of the magnetic field $H_{HA}$ and the magnetic field $H_{EA}$ exerted on the recording layer 35), and, when a composite magnetic field corresponding to the outside ($OUT_1$, $OUT_2$) of the asteroid curve is generated, inversion of the magnetization direction of the recording layer 35 occurs, whereby data is written. On the other hand, when a composite magnetic field corresponding to the inside (IN) of the asteroid curve is generated, inversion of the magnetization direction of the recording layer 35 does not occur. In addition, to the MRAMs other than that at the intersection between the write word line RWL and the bit line BL through which the current flow, a magnetic field generated by the write word line RWL or bit line BL alone is applied, so that if the magnitude of this magnetic field is not less than the switching magnetic field ($H_{Switch}$) [the region ($OUT_2$) on the outside of the broken lines in FIG. 20], the magnetization direction of the recording layer 35 constituting the other MRAMs than that at the intersection would also be inverted. Therefore, only in the case where the composite magnetic field is on the outside of the asteroid curve and in the region ($OUT_1$) on the inside of the broken lines in FIG. 20, selective writing into the selected MRAM can be achieved.

More specifically, in writing the data, as has been described above, currents are passed through the bit line BL and the write word line RWL to generate a composite magnetic field; in this case, the magnitude of the composite magnetic field is set to be located slightly on the outside of the asteroid curve, and about one half of the composite magnetic field is generated by use of the bit line BL and the write word line RWL. Incidentally, such a state as this is called a "half selected" state. By achieving such a "half selected" state, data is written into the tunnel magnetoresistance device TMJ located at the intersection between the bit line BL through which the current flows and the write word line RWL through which the current flows. On the other hand, no data is written into the tunnel magnetoresistance devices TMJs located at the intersections between the bit lines BLs through which the current flows and the write word lines RWLs through which no current flows, or the tunnel magnetoresistance devices TMJs located at the intersections between the bit lines BLs through which no current flows and the write word lines RWLs through which current flows. Incidentally, such a tunnel magnetoresistance device TMJ (into which no data is written) will be referred to as a non-selected tunnel magnetoresistance device TMJ, for convenience. (see U.S. Pat. No. 6,081,445, U.S. Patent Publications Nos. 6,545,906 B1 and 6,633,498 B1, and S. S. Parkin et al, Physical Review Letters, 7 may, pp.2304-2307 (1990))

SUMMARY OF THE INVENTION

However, though data is intrinsically not written into non-selected tunnel magnetoresistance devices TMJs, data may be written into the non-selected tunnel magnetoresistance devices TMJs in the case where the dispersion of the switching magnetic field ($H_{Switch}$) is large. Specifically, where the dispersion of the switching magnetic field ($H_{Switch}$) is large, the writing margin for the tunnel magnetoresistance devices TMJs is so small that a large-capacity memory cannot be realized. Therefore, it is important to minimize the dispersion of the switching magnetic field ($H_{Switch}$), and the suppression of the dispersion leads to an enlargement of the data writing margin.

Meanwhile, the magnitude of the switching magnetic field ($H_{Switch}$) is determined principally by the shape anisotropy in plan-view shape of the tunnel magnetoresistance device TMJ (particularly, the plan-view shape of the recording layer 35) and the magnetic anisotropy of the tunnel magnetoresistance device TMJ. Therefore, the plan-view shape of the tunnel magnetoresistance device TMJ (particularly, the plan-view shape of the recording layer 35) is a major factor in control of magnetic characteristics and, hence, the operations of writing the data "0" and "1". It has been known to set the plan-view shape of the tunnel magnetoresistance device TMJ to one of the various plan-view shapes shown in FIGS. 22A to 22F, for reducing the dispersion of the switching magnetic field ($H_{Switch}$). However, even the adoption of such plan-view shapes is yet unsatisfactory for reducing the dispersion of the switching magnetic field ($H_{Switch}$). In a broader sense, this approach is not satisfactory in terms of the data writing margin for the magnetoresistance devices.

Accordingly, there is a need for a nonvolatile magnetic memory device including magnetoresistance devices capable of reducing the dispersion of the switching magnetic field ($H_{Switch}$) of, for example, tunnel magnetoresistance devices, or, in a broader sense, capable of providing a sufficient data writing margin, and for a photomask for use in a lithography step for manufacturing such magnetoresistance devices.

According to first to eighth embodiments of the present invention, there is provided a nonvolatile magnetic memory device including a magnetoresistance device having a recording layer formed of a ferromagnetic material for storing information by use of variation in resistance depending on the magnetization inversion state thereof.

In the nonvolatile magnetic memory device according to a first embodiment of the present invention, the plan-view shape of the recording layer is a pseudo-rhombic shape;

at least two of the four sides constituting the pseudo-rhombic shape each including a smooth curve having a central portion curved toward the center of the pseudo-rhombic shape;

the easy axis of magnetization of the recording layer is substantially parallel to the longer axis of the pseudo-rhombic shape;

the hard axis of magnetization of the recording layer is substantially parallel to the shorter axis of the pseudo-rhombic shape; and the sides constituting the plan-view shape of the recording layer are smoothly connected to each other.

Here, the "pseudo-rhombic shape" means that the plan-view shape of the recording layer has the following shape, as viewed macroscopically. Let the four sides be represented by side A, side B, side C, and side D in this order counterclockwise, the four sides A, B, C, and D be approximated by line segments, the length of the line segment opposed to side A be $L_a$, the length of the line segment opposed to side B be $L_b$, the length of the line segment opposed to side C be $L_c$, and the length of the line segment opposed to side D be $L_d$, then the plan-view shape satisfies $L_a = L_b = L_c = L_d$, or satisfies $L_a \approx L_b \approx L_c \approx L_d$, or satisfies $L_a = L_b \neq L_c = L_d$, or satisfies $L_a \approx L_b \neq L_c \approx L_d$. When the recording layer is viewed microscopically, at least two (at maximum, four) of the four sides constituting the plan-view shape of the recording layer each include a curve.

Here, in general, where a real variable function F(X) has a continuous differential coefficient at each point in an interval a<X<b, the function F(X) is said to be "smooth" or "differentiable" over the interval. In addition, the expression "substantially parallel" means that two line segments or straight lines do not intersect each other, or that their intersection angle is within the range of ±20°. Besides, the expression "substantially orthogonal" means that two line segments or straight lines orthogonally intersect each other, or that their intersection angle is in the range of 90°±20°. Further, the expression "substantially line symmetric" includes the meaning of not only the case where when the recording layer is folded along the axis of symmetry, the two portions of the recording layer folded perfectly overlap each other but also the case where the two portions of the recording layer folded do not perfectly overlap each other because of dispersions in the manufacturing process of the recording layer. Besides, the "center" means the center of gravity of the shape. Hereinafter, also, the expressions "smooth", "substantially parallel", "substantially line symmetric" and "center" will be used in the meanings just mentioned.

In the nonvolatile magnetic memory device according to this embodiment, it is desirable the relationship $1.0 < L_L/L_S \leq 10$, preferably $1.2 \leq L_L/L_S \leq 3.0$, is satisfied, where the length of the longer axis of the pseudo-rhombic shape is $2L_L$, and the length of the shorter axis of the shape is $2L_S$. In addition, it is desirable that the relationship $0.1 \leq r_L/L_S \leq 1.0$, preferably $0.2 \leq r_L/L_S \leq 0.8$, is satisfied, and the relationship $0.1 \leq r_S/L_L \leq 10$, preferably $0.2 \leq r_S/L_L \leq 5$, is satisfied, where $r_L$ is the radius of curvature of the plan-view shape of the recording layer at the intersection between the longer axis of the pseudo-rhombic shape and the plan-view shape of the recording layer, and $r_S$ is the radius of curvature of the plan-view shape of the recording layer at the intersection between the shorter axis of the pseudo-rhombic shape and the plan-view shape of the recording layer.

In the nonvolatile magnetic memory device according to this embodiment, it is preferable that at least two points of inflection are present in each of the sides each including a smooth curve having a central portion thereof curved.

In the nonvolatile magnetic memory device according to this embodiment including the above-mentioned properties, it is desirable that when the pseudo-rhombic shape is divided into two regions by the longer axis of the pseudo-rhombic shape, the two sides each including a smooth curve having a central portion thereof curved belong to one of the regions.

Alternatively, in the nonvolatile magnetic memory device according to this embodiment including the above-mentioned properties, it is desirable that the four sides each include a smooth curve having a central portion thereof curved toward the center of the pseudo-rhombic shape.

In the nonvolatile magnetic memory device according to this embodiment including the above-mentioned properties, it is desirable that the plan-view shape of the recording layer is substantially line symmetric with respect to the shorter axis of the pseudo-rhombic shape. Such a configuration includes the case where the two of the four sides constituting the pseudo-rhombic shape each include a smooth curve having a central portion thereof curved toward the center of the pseudo-rhombic shape, and the case where all of the four sides constituting the pseudo-rhombic shape each include a smooth curve having a central portion thereof curved toward the center of the pseudo-rhombic shape. Furthermore, it is desirable that the plan-view shape of the recording layer is substantially line symmetric with respect to the longer axis of the pseudo-rhombic shape.

In the nonvolatile magnetic memory device according to a second embodiment of the present invention, the plan-view shape of the recording layer includes four sides;

at least two of the four sides each include a smooth curve;

the plan-view shape of the recording layer is inscribed in a virtual rhombus having a longer axis, and a shorter axis orthogonally intersecting the longer axis at the bisecting point of the longer axis, the longer axis being substantially parallel to the easy axis of magnetization of the recording layer, and the shorter axis being substantially parallel to the hard axis of magnetization of the recording layer;

each of the sides each including the smooth curve contacts the corresponding side of the virtual rhombus at at least two points; and the sides constituting the plan-view shape of the recording layer are smoothly connected to each other.

Here, in the "virtual rhombus", when the four sides of the virtual rhombus are represented by side A (length: $L_a$), side B (length: $L_b$), side C (length: $L_c$), and side D (length $L_d$) in this order counterclockwise, the virtual rhombus satisfies $L_a = L_b = L_c = L_d$, or satisfies $L_a \approx L_b \approx L_c \approx L_d$, or satisfies $L_a = L_b \neq L_c = L_d$, or satisfies $L_a \approx L_b \neq L_c \approx L_d$.

In the nonvolatile magnetic memory according to this embodiment of the present invention, it is desirable that the relationship $1.0 < L_{i-L}/L_{i-S} \leq 10$, preferably $1.2 \leq L_{i-L}/L_{i-S} \leq 3.0$, is satisfied, where the length of the longer axis is $2L_{i-L}$, and the length of the shorter axis is $2L_{i-S}$. In addition, it is desirable that the relationship $0.1 \leq r_L/L_{i-S} < 1.0$, preferably $0.2 \leq r_L/L_{i-S} \leq 0.8$, is satisfied and that the relationship $0.1 \leq r_S/L_{i-L} \leq 10$, preferably $0.2 \leq r_S/L_{i-L} \leq 5$, is satisfied, where $r_L$ is the radius of curvature of the plan-view shape of the recording layer at the intersection between the longer axis of the virtual rhombic and the plan-view shape of the recording layer, and $r_S$ is the radius of curvature of the plan-view shape of the recording layer at the intersection between the shorter axis of the virtual rhombic and the plan-view shape of the recording layer. Further, in an interval $0 < X < X_1$ (described below) of the side including a smooth curve, it is desirable that the relationship $0 < D_{MAX} \leq X_1/2$, preferably $X_1/30 \leq D_{MAX} \leq X_1/3$, is satisfied, where $D_{MAX}$ is the maximum distance between the side including a smooth curve and the corresponding side of the virtual rhombic.

In the nonvolatile magnetic memory device according to this embodiment of the present invention, it is desirable that when, in each of the sides constituting the plan-view shape of the recording layer and each including the smooth curve, (a) the point located closest to the shorter axis of the virtual rhombus, of the at least two points of contact with the side of the virtual rhombus is made to be the origin (0, 0) of a Gaussian coordinate system, (b) the point located closest to the longer axis of the virtual rhombus, of the at least two points of contact with the side of the virtual rhombus is made to be $(X_1, 0)$ [where $X_1>0$], (c) the intersection with the shorter axis of the virtual rhombus is made to be $(X_S, Y_S)$ [where $X_S<0$, $Y_S<0$], (d) the intersection with the longer axis of the virtual rhombus is made to be $(X_L, Y_L)$ [where $X_L>0$, $Y_L<0$]; and the side is represented by a real variable function $F(X)$, and the intersection of the longer axis and the shorter axis of the virtual rhombus is located in the third quadrant or the fourth quadrant; then the real variable function $F(X)$ has a continuous differential coefficient at each point in an interval $X_S<X<X_L$, and the real variable function $F(X)$ has at least two points of inflection in an interval $0<X<X_1$.

In the nonvolatile magnetic memory device according to this embodiment of the present invention including the above-mentioned properties, it is desirable that the plan-view shape of the recording layer is substantially line symmetric with respect to the shorter axis of the virtual rhombus. Such a configuration includes the case where two of the four sides constituting the plan-view shape of the recording layer each include a smooth curve, and the case where all of the four sides each include a smooth curve. Alternatively, it is desirable that the four sides of the plan-view shape of the recording layer each include a smooth curve, and that the plan-view shape of the recording layer is substantially line symmetric with respect to the virtual rhombus, and is substantially line symmetric with respect to the longer axis of the virtual rhombus.

In the nonvolatile magnetic memory device according to a third embodiment of the present invention, the plan-view shape of the recording layer includes a first shape, and two projected portions oppositely projected from the first shape;

the two projected portions are positioned on the projected portion axis;

the axis of each of the projected portions passes through the center of the first shape and orthogonally intersects the first shape axis passing through the center of the first shape;

the first shape includes one shape selected from the group including an ellipse, a flat oval, and a flat circle;

the projected portions each include one shape selected from the group including a part of a circle, a part of an ellipse, a part of a flat oval, and a part of a flat circle;

the easy axis of magnetization of the recording layer is substantially parallel to the first shape axis;

the hard axis of magnetization of the recording layer is substantially parallel to the projected portion axis;

the relationship $L_L>L_S$ is satisfied, where $2L_L$ is the length of the first shape along the first shape axis, and $2L_S$ is the distance between the tip ends of the two projected portions along the projected portion axis; and the portion at which the visible outline of the first shape and the visible outline of each side projected portion intersect includes a smooth curve.

In the nonvolatile magnetic memory device according to this embodiment of the present invention, examples of the combination of (the first shape, the projected portion) include (an ellipse, a part of a circle), (an ellipse, a part of an ellipse), (an ellipse, a part of a flat oval), (an ellipse, a part of a flat circle), (a flat oval, a part of a circle), (a flat oval, a part of an ellipse), (a flat oval, a part of a flat oval), (a flat oval, a part of a flat circle), (a flat circle, a part of a circle), (a flat circle, a part of an ellipse), (a flat circle, a part of a flat oval), (a flat circle, a part of a flat circle).

In the nonvolatile magnetic memory device according to this embodiment of the present invention, it is desirable that the relationship $1.0<L_L/L_S\leq10$, preferably $1.2\leq L_L/L_S\leq3.0$, is satisfied. In addition, it is desirable that the relationship $0.1\leq r_L/L_S\leq1.0$, preferably $0.2\leq r_L/L_S\leq0.8$, is satisfied, and the relationship $0.1\leq r_S/L_L\leq10$, preferably $0.2\leq r_S/L_L\leq5$, is satisfied, where $r_L$ is the radius of curvature of the plan-view shape of the recording layer as the intersection between the first shape axis and the plan-view shape of the recording layer, and $r_S$ is the radius of curvature of the plan-view shape of the recording layer at the intersection between the projected portion axis and the plan-view shape of the recording layer.

In the nonvolatile magnetic memory device according to this embodiment of the present invention, the plan-view shape of the recording layer may be substantially line symmetric with respect to the projected portion axis. Incidentally, such a configuration includes the case where the two projected portions are substantially line symmetric with respect to the first shape axis, and the case where the two projected portions are not line symmetric. It is desirable that the plan-view shape of the recording layer is substantially line symmetric with respect to the projected portion axis, and is line symmetric with respect to the first shape axis.

In the nonvolatile magnetic memory device according to a fourth embodiment of the present invention, the plan-view shape of the recording layer is a superposed shape in which a first shape and a second shape having a center coinciding with the center of the first shape are superposed on each other so that the second shape is projected from the first shape at two positions;

the first shape axis passing through the center of the first shape and the second shape axis passing through the center of the second shape orthogonally intersect each other;

the first shape includes one shape selected from the group including an ellipse, a flat oval, and a flat circle;

the second shape includes one shape selected from the group including a circle, an ellipse, a flat oval, and a flat circle;

the easy axis of magnetization of the recording layer is substantially parallel to the first shape axis;

the hard axis of magnetization of the recording layer is substantially parallel to the second shape axis;

the relationship $L_L>L_S$ is satisfied, where $2L_L$ is the length of the first shape along the first shape axis, and $2L_S$ is the length of the second shape along the second shape axis; and the portion at which the visible outline of the first shape and the visible outline of the second shape intersect each other includes a smooth curve.

In the nonvolatile magnetic memory device according to this embodiment of the present invention, examples of the combination of (the first shape, the second shape) include (an ellipse, a circle), (an ellipse, an ellipse), (an ellipse, a flat oval), (an ellipse, a flat circle), (a flat oval, a circle), (a flat oval, an ellipse), (a flat oval, a flat oval), (a flat oval, a flat circle), (a flat circle, a circle), (a flat circle, an ellipse), (a flat circle, a flat oval), and (a flat circle, a flat circle).

In the nonvolatile magnetic memory device according to this embodiment of the present invention, it is desirable that the relationship $1.0<L_L/L_S\leqq10$, preferably $1.2\leqq L_L/L_S\leqq3.0$, is satisfied. In addition, it is desirable that the relationship $0.1\leqq r_L/L_S\leqq1.0$, preferably $0.2\leqq r_L/L_S\leqq0.8$, is satisfied, and the relationship $0.1\leqq r_S/L_L\leqq10$, preferably $0.2\leqq r_S/L_L\leqq5$, is satisfied, where $r_L$ is the radius of curvature of the plan-view shape of the recording layer at the intersection between the first shape axis and the plan-view shape of the recording layer, and $r_S$ is the radius of curvature of the plan-view shape of the recording layer at the intersection between the second shape axis and an the plan-view shape of the recording layer.

In the nonvolatile magnetic memory device according to this embodiment of the present invention, the plan-view shape of the recording layer may be substantially line symmetric with respect to the second shape axis. Such a configuration includes the case where the two projected regions of the second shape are substantially line symmetric with respect to the first shape axis, and the case where the two projected regions are not line symmetric. It is desirable that the plan-view shape of the recording layer is substantially line symmetric with respect to the second shape axis and is substantially line symmetric with respect to the first shape axis.

In the nonvolatile magnetic memory device according to a fifth embodiment of the present invention, the plan-view shape of the recording layer includes a pseudo isosceles triangular shape;

the oblique lines of the pseudo isosceles triangular shape each include a smooth curve having a central portion thereof curved toward the center of the pseudo isosceles triangular shape;

the length of the imaginary base of the pseudo isosceles triangular shape is greater than the virtual height of the pseudo isosceles triangular shape;

the easy axis of magnetization of the recording layer is substantially parallel to the base of the pseudo isosceles triangular shape;

the hard axis of magnetization of the recording layer is substantially orthogonal to the base of the pseudo isosceles triangular shape; and the sides constituting the plan-view shape of the recording layer are smoothly connected to each other.

Here, the "pseudo isosceles triangular shape" means that the plan-view shape of the recording layer has the following shape, as viewed macroscopically. Let the two oblique lines A and B be approximated by line segments, let the length of the line segment opposed to the oblique line A be $L_a$, and let the length of the line segment opposed to the oblique line B be $L_b$, then the shape satisfies the relationship $L_a=L_b$, or satisfies the relationship $L_a\approx L_b$. When the recording layer is viewed microscopically, the two oblique lines constituting the plan-view shape of the recording layer each include a curve.

In the nonvolatile magnetic memory device according to this embodiment of the present invention, the length of the imaginary base of the pseudo isosceles triangular shape is represented by $2L_B$, the virtual height is represented by H, the average radius of curvature of the plan-view shape of the recording layer at the portion where the oblique line and the base line of the pseudo isosceles triangular shape are smoothly connected to each other is represented by $r_L$, and the radius of curvature of the plan-view shape of the recording layer at the intersection between the two oblique lines of the pseudo isosceles triangular shape is represented by $r_S$. Here, the intersection between the two oblique lines of the pseudo isosceles triangular shape means the point at which the perpendicular bisector of the imaginary base intersects the curve obtained by connecting the two oblique lines of the pseudo isosceles triangular shape into one line. In addition, the imaginary base of the pseudo isosceles triangular shape means an imaginary line which, when the base of the pseudo isosceles triangular shape is approximated by a straight line (this straight line is called base approximation straight line), is parallel to the base approximation straight line, which passes through a point being located on the side of the intersection between the two oblique lines of the pseudo isosceles triangular shape and being spaced from the base approximation straight line by a distance $r_L$. Further, the length $2L_B$ of the imaginary base is defined as the distance between the intersections of the imaginary base with the plan-view shape of the recording layer at the portions where the oblique lines and the base of the pseudo isosceles triangular shape are smoothly connected. Besides, the virtual height H is defined as the distance from the intersection between the two oblique lines of the pseudo isosceles triangular shape to the imaginary base. In this case, it is desirable that the relationship $1.0<L_B/H\leqq10$, preferably $1.2\leqq L_B/H\leqq3.0$, is satisfied. In addition, it is desirable that the relationship $0.1\leqq r_L/H\leqq1.0$, preferably $0.2\leqq r_L/H\leqq0.8$, is satisfied, and it is desirable that the relationship $0.1\leqq r_S/L_B\leqq10$, preferably $0.2\leqq r_S/L_B\leqq5$ is satisfied.

In the nonvolatile magnetic memory device according to this embodiment of the present invention, it is preferable that at least two points of inflection are present in the oblique line of the pseudo isosceles triangular shape. It is desirable that the plan-view shape of the recording layer is substantially line symmetric with respect to the perpendicular bisector of the imaginary base of the pseudo isosceles triangular shape.

In the nonvolatile magnetic memory device according to a sixth embodiment of the present invention, the plan-view shape of the recording layer includes three sides;

at least two of the three sides each include a smooth curve;

the plan-view shape of the recording layer is inscribed in a virtual isosceles triangle in which the length of the imaginary base is $2L_{i-B}$, the virtual height is $H_i$ [where $H_i<L_{i-B}$], the base is substantially parallel to the easy axis of magnetization of the recording layer, and the perpendicular to the base is substantially parallel to the hard axis of magnetization of the recording layer;

each of the sides each including the smooth curve contacts an oblique line of the virtual isosceles triangle at at least two points; and the sides constituting the plan-view shape of the recording layer are smoothly connected to each other.

In the nonvolatile magnetic memory device according to this embodiment of the present invention, the imaginary base of the virtual isosceles triangle means an imaginary line being parallel to the base of the virtual isosceles triangle and passing a point which is located on the side of the intersection between the two oblique lines of the virtual isosceles triangle and which is spaced from the base of the virtual isosceles triangle by a distance $r_L$, where $r_L$ is the average radius of curvature of the plan-view shape of the recording layer at the portion where a side constituting the plan-view shape of the recording layer and corresponding to the base of the virtual isosceles triangle is smoothly connected to a side constituting the plan-view shape of the recording layer and corresponding to the oblique line of the virtual isosceles triangle. In addition, the length $2L_{i-B}$ of the imaginary base is defined as the distance between the imaginary base and the intersection of the two oblique lines of the virtual isosceles triangle. Besides, the virtual height $H_i$ is defined as the distance from the intersection of the two oblique lines of the virtual isosceles triangle to the imaginary base. In the nonvolatile magnetic memory device according to this embodiment of the present invention, it is desirable that the relationship $1.0<L_{i-B}/H_i\leqq10$, preferably $1.2 \leq L_{i-B}/H_i \leq 3.0$, is satisfied. In addition, it is desirable that the relationship $0.1 \leq r_L/H_i \leq 1.0$, preferably $0.2 \leq r_L/H_i \leq 0.8$, is satisfied, and it is desirable that the relationship $0.1 \leq r_S/L_{i-B} \leq 10$, preferably $0.2 \leq r_S/L_{i-B} \leq 5$, is satisfied, where $r_S$ is the radius of curvature of the plan-view shape of the recording layer at the intersection between the plan-view shape of the recording layer and the bisector of the angle formed at the intersection of the two oblique lines of the virtual isosceles triangle. Further, in the interval $0 < X < X_1$ (described below) of the side including a smooth curve, let the maximum distance between the side including the smooth curve and the corresponding oblique side of the virtual isosceles triangle be $D_{MAX}$, then it is desirable that the relationship $0 < D_{MAX} \leq X_1/2$, preferably $X_1/30 \leq D_{MAX} \leq X_1/3$, is satisfied.

In the nonvolatile magnetic memory device according to this embodiment of the present invention, it is desirable that when, in each of the sides each including the smooth curve and constituting the plan-view shape of the recording layer, (a) the point closest to the intersection between the two oblique lines of the virtual isosceles triangle, of at least two points of contact with the oblique line, is made to be the origin (0, 0) of a Gaussian coordinate system, (b) the point closest to the intersection between the oblique line and the imaginary base of the virtual isosceles triangle, of at least two points of contact with the oblique line, is made to be $(X_1, 0)$ [where $X_1 > 0$], (c) the intersection with the perpendicular bisector of the base of the virtual isosceles triangle is made to be $(X_S, Y_S)$ [where $X_S < 0, Y_S < 0$], (d) the intersection with the imaginary base of the virtual isosceles triangle is made to be $(X_L, Y_L)$ [where $X_L > 0, Y_L < 0$]; and the side is represented by a real variable function $F(X)$, and the intersection between the perpendicular bisector of the base of the virtual isosceles triangle and the base of the virtual isosceles triangle is located in the third quadrant or the fourth quadrant;

the real variable function $F(X)$ has a continuous differential coefficient at each point in an interval $X_S < X < X_L$, and the real variable function $F(X)$ has at least two points of inflection in an interval $0 < X < X_1$.

In the nonvolatile magnetic memory device according to this embodiment of the present invention including the above-mentioned preferable configuration, it is desirable that the plan-view shape of the recording layer is substantially line symmetric with respect to the perpendicular bisector of the base of the virtual isosceles triangle.

In the nonvolatile magnetic memory device according to a seventh embodiment of the present invention, the plan-view shape of the recording layer includes a first shape, and a projected portion projected from the first shape;

the projected portion is located on the projected portion axis;

the projected portion axis passes through the center of the first shape, and orthogonally intersects the first shape axis passing through the center of the first shape;

the first shape has one shape selected from the group including an ellipse, a flat oval, and a flat circle;

the projected portion has one shape selected from the group including a part of a circle, a part of an ellipse, a part of a flat oval, and a part of a flat circle;

the easy axis of magnetization of the recording layer is substantially parallel to the first shape axis;

the hard axis of magnetization of the recording layer is substantially parallel to the projected portion axis;

the relationship $L_L > L_S$ is satisfied, where $2L_L$ is the length of the first shape along the first shape axis, and $L_S$ is the distance from a tip end portion of the projected portion to the center of the first shape along the projected portion axis; and the portion at which the visible outline of the first shape and the visible outline of the projected portion intersect includes a smooth curve.

In the nonvolatile magnetic memory device according to this embodiment of the present invention, examples of the combination of (the first shape, the projected portion) include (an ellipse, a part of a circle), (an ellipse, a part of an ellipse), (an ellipse, a part of a flat oval), (an ellipse, a part of a flat circle), (a flat oval, a part of a circle), (a flat oval, a part of an ellipse), (a flat oval, a part of a flat oval), (a flat oval, a part of a flat circle), (a flat circle, a part of a circle), (a flat circle, a part of an ellipse), (a flat circle, a part of a flat oval), and (a flat circle, a part of a flat circle).

In the nonvolatile magnetic memory device according to this embodiment of the present invention, it is desirable that the relationship $1.0 < L_L/L_S \leq 10$, preferably $1.2 \leq L_L/L_S \leq 3.0$, is satisfied. In addition, it is desirable that the relationship $0.1 \leq r_L/L_S \leq 1.0$, preferably $0.2 \leq r_L/L_S \leq 0.8$, is satisfied, and it is desirable that the relationship $0.1 \leq r_S/L_L \leq 10$, preferably $0.2 \leq r_S/L_L \leq 5$, is satisfied, where $r_L$ is the radius of curvature of the plan-view shape of the recording layer at the intersection between the first shape axis and the plan-view shape of the recording layer, and $r_S$ is the radius of curvature of the plan-view shape of the recording layer at the intersection between the projected portion axis and the plan-view shape of the recording layer.

In the nonvolatile magnetic memory device according to this embodiment of the present invention, it is desirable that the plan-view shape of the recording layer is substantially line symmetric with respect to the projected portion axis.

In the nonvolatile magnetic memory device according to an eighth embodiment of the present invention, the plan-view shape of the recording layer is a superposed shape in which a first shape and a second shape are superposed on each other so that the second shape is projected from the first shape at one position;

the second shape is located on the second shape axis;

the second shape axis passes through the center of the first shape, and orthogonally intersects the first shape axis passing through the center of the first shape;

the first shape has one shape selected from the group including an ellipse, a flat oval, and a flat circle;

the second shape has one shape selected from the group including a circle, an ellipse, a flat oval, and a flat circle;

the easy axis of magnetization of the recording layer is substantially parallel to the first shape axis;

the hard axis of magnetization of the recording layer is substantially parallel to the second shape axis;

the relationship $L_L > L_S$ is satisfied, where $2L_L$ is the length of the first shape along the first shape axis, and $L_S$ is the distance from a tip end portion of the second shape to the center of the first shape along the second shape axis; and the portion at which the visible outline of the first shape and the visible outline of the second shape intersect includes a smooth curve.

In the nonvolatile magnetic memory device according to this embodiment of the present invention, examples of the combination of (the first shape, the second shape) include (an ellipse, a circle), (an ellipse, an ellipse), (an ellipse, a flat oval), (an ellipse, a flat circle), (a flat oval, a circle, (a flat oval, an ellipse), (a flat oval, a flat oval), (a flat oval, a flat circle), (a flat circle, a circle), (a flat circle, an ellipse), (a flat circle, a flat oval), and (a flat circle, a flat circle).

In the nonvolatile magnetic memory device according to this embodiment of the present invention, it is desirable that the relationship $1.0 < L_L/L_S \leq 10$, preferably $1.2 \leq L_L/L_S \leq 3.0$, is satisfied. In addition, it is desirable that the relationship $0.1 \leq r_L/L_S \leq 1.0$, preferably $0.2 \leq r_L/L_S \leq 0.8$, is satisfied, and it is desirable that $0.1 \leq r_S/L_L \leq 10$, preferably $0.2 \leq r_S/L_L \leq 5$, is satisfied, where $r_L$ is the radius of curvature of the plan-view shape of the recording layer at the intersection between the first shape axis and the plan-view shape of the recording layer, and $r_S$ is the radius of curvature of the plan-view shape of the recording layer at the intersection between the second shape axis and the plan-view shape of the recording layer.

In the nonvolatile magnetic memory device according to this embodiment of the present invention, it is desirable that the plan-view shape of the recording layer is substantially line symmetric with respect to the second shape axis.

The plan-view shapes of the recording layers in the nonvolatile magnetic memory devices according to the first to eighth embodiments of the present invention will be referred to as the Saturn type, for convenience.

In the nonvolatile magnetic memory devices according to the first to eighth embodiments of the present invention including the various forms and configurations, specifically, examples of the nonvolatile magnetic memory device include a nonvolatile magnetic memory device having a tunnel magnetoresistance device using the TMR effect, and a nonvolatile magnetic memory device having a spin implantation type magnetoresistance device applying the inversion of magnetization by spin implantation.

In the nonvolatile magnetic memory device having a tunnel magnetoresistance device, specifically, the magnetoresistance device is a tunnel magnetoresistance device having a laminate structure including a first ferromagnetic material layer, a tunnel insulation film, and a second ferromagnetic material layer, in this order from the lower side; in this case, the recording layer (referred to also as a free layer) constitutes the second ferromagnetic material layer.

Further, the nonvolatile magnetic memory device may have a structure including first and second wirings. The first wiring extending in a first direction, including a conductor layer, and being electrically insulated from the first ferromagnetic material layer is provided on the lower side of the first ferromagnetic material layer, with a lower interlayer insulation layer therebetween. The second wiring extending in a second direction different from the first direction, including a conductor layer, and being electrically connected to the second ferromagnetic material layer or electrically isolated from the second ferromagnetic material layer is provided on the upper side of the second ferromagnetic material layer, with an upper interlayer insulation layer therebetween.

Furthermore, the nonvolatile magnetic memory device may have a structure in which: a selection transistor including a field effect transistor is provided on the lower side of the first wiring, with an interlayer insulation layer therebetween; and the first ferromagnetic material layer is electrically connected to one of source/drain regions of the selection transistor.

In other words, specifically but not limitatively, the nonvolatile magnetic memory device having a tunnel magnetoresistance layer may include:

a selection transistor provided on a semiconductor substrate;

an interlayer insulation layer covering the selection transistor;

a lower interlayer insulation layer; and an upper interlayer insulation layer.

A write word line is formed on the lower interlayer insulation layer, the lower interlayer insulation layer covers the write word line and the interlayer insulation layer, the first ferromagnetic material layer is formed on the lower interlayer insulation layer, the upper interlayer insulation layer covers the tunnel magnetoresistance device and the lower interlayer insulation layer, an extension portion of the first ferromagnetic material layer or an extraction electrode extending on the upper side of the lower interlayer insulation layer from the first ferromagnetic material layer is electrically connected to the selection transistor through a contact hole (or a contact hole and a landing pad portion) provided in the lower interlayer insulation layer and the interlayer insulation layer, and a bit line is formed on the upper interlayer insulation layer.

In accordance with one embodiment of the present invention, there is provided a photomask for use in a lithography step for forming a recording layer constituting a magnetoresistance device in a nonvolatile magnetic memory device, the recording layer including:

(A) a ferromagnetic material for storing information by use of variation in resistance depending on the magnetization inversion state thereof, (B) the plan-view shape of the recording layer being a pseudo-rhombic shape, (C) the sides constituting the pseudo-rhombic shape each including a smooth curve having a central portion thereof curved toward the center of the pseudo-rhombic shape, (D) the easy axis of magnetization of the recording layer being substantially parallel to the longer axis of the pseudo-rhombic shape, (E) the hard axis of magnetization of the recording layer being substantially parallel to the shorter axis of the pseudo-rhombic shape, and (F) the sides being smoothly connected to each other.

The photomask is provided with a pattern including a first shape and a second shape, in which the first shape and the second shape having a center coinciding with the center of the first shape are superposed on each other so that the second shape is projected from the first shape at two positions;

the first shape axis passing through the center of the first shape and the second shape axis passing through the center of the second shape orthogonally intersect each other;

the first shape has one shape selected from the group including a regular polygon, an ellipse, a flat oval, and a flat circle of which the length along the first shape axis substantially parallel to the easy axis is $2L_{p-1L}$, and the length along the direction perpendicular to the first shape axis is $2L_{p-1S}$ [where $L_{p-1S} < L_{p-1L}$]; and the second shape has one shape selected from the group including a regular polygon, a circle, an ellipse, a flat oval, and a flat circle of which the length along the second shape axis substantially parallel to the hard axis is $2L_{p-2L}$ [where $L_{p-1S} < L_{p-2L} < L_{p-1L}$], and the length along the direction perpendicular to the second shape axis is $2L_{p-2S}$ [where $L_{p-2S} < L_{p-1L}$].

Incidentally, while the second shape is projected from the first shape at two positions, the shape of one of the projected regions of the second shape projected from the first shape and the shape of the other of the projected regions of the second shape projected from the first shape may be the same or different. Where the shapes of the projected regions are the same, the plan-view shape of the recording layer is, for example, substantially line symmetric with respect to the shorter axis of the pseudo-rhombic shape, and is substantially line symmetric with respect also to the longer axis of the pseudo-rhombic shape. On the other hand, where the shapes of the projected regions are different, the plan-view shape of the recording layer is, for example, substantially line symmetric with respect only to the shorter axis of the pseudo-rhombic shape.

In accordance with another embodiment of the present invention, there is provided a photomask for use in a lithography step for forming a recording layer constituting a magnetoresistance device in a nonvolatile magnetic memory device, the recording layer including:

(A) a ferromagnetic material for storing information by use of variation in resistance depending on the magnetization inversion state thereof;

(B) the plan-view shape of the recording layer being a pseudo isosceles triangular shape;

(C) the oblique lines of the pseudo isosceles triangular shape each including a smooth curve having a central portion thereof curved toward the center of the pseudo isosceles triangular shape;

(D) the easy axis of magnetization of the recording layer being substantially parallel to the base of the pseudo isosceles triangular shape;

(E) the hard axis of magnetization of the recording layer being substantially orthogonal to the base of the pseudo isosceles triangular shape; and (F) the sides of the plan-view shape being smoothly connected to each other.

The photomask is provided with a pattern including a first shape and a second shape, in which the first shape and the second shape are superposed on each other so that the second shape is projected from the first shape at one position;

the second shape is located on the second shape axis;

the second shape axis passes through the center of the first shape, and orthogonally intersects the first shape axis passing through the center of the first shape;

the first shape has one shape selected from the group including a regular polygon, an ellipse, a flat oval, and a flat circle of which the length along the first shape axis substantially parallel to the easy axis is $2L_{p-1L}$, and the length along the direction passing through the center of the first shape and being perpendicular to the first shape axis is $2L_{p-1S}$ [where $L_{p-1S} < L_{p-1L}$]; and the second shape has one shape selected from the group including a regular polygon, a circle, an ellipse, a flat oval, and a flat circle of which the distance from a tip end portion of the second shape to the center of the first shape along the second shape axis substantially parallel to the hard axis is $L_{p-2L}$ [where $L_{p-1S} < L_{p-2L} < L_{p-1L}$], and the length along the direction passing through the center of the first shape and being perpendicular to the second shape axis is $2L_{p-2S}$ [where $L_{p-2S} < L_{p-1L}$].

In the photomask according to the one embodiment or another embodiment of the present invention, examples of the combination of (the first shape, the second shape) include (a regular polygon, a regular polygon), (a regular polygon, a circle), (a regular polygon, an ellipse), (a regular polygon, a flat oval), (a regular polygon, a flat circle), (an ellipse, a regular polygon), (an ellipse, a circle), (an ellipse, an ellipse), (an ellipse, a flat oval), (an ellipse, a flat circle), (a flat oval, a regular polygon), (a flat oval, a circle), (a flat oval, an ellipse), (a flat oval, a flat oval), (a flat oval, a flat circle), (a flat circle, a regular polygon), (a flat circle, a circle), (a flat circle, an ellipse), (a flat circle, a flat oval), and (a flat circle, a flat circle).

When a resist material formed on a wafer is provided with a pattern by exposure light, that which is used for reduction projection may be called a reticule, and that which is used for one-to-one projection may be called a mask. Alternatively, that which corresponds to an original may be called a reticule, and that which is duplicated from the reticule may be called a mask. Herein, the reticules and masks in these various senses are generically called photomask.

In the photomask according to the one embodiment or another embodiment of the present invention, the number of the second shape(s) is not limited to one, and two or more second shapes may be used in combination with the first shape.

In the first shape, the second shape or the shape of the projected portion in the nonvolatile magnetic memory device according to the third, fourth, seventh or eighth embodiment of the present invention or the photomask according to the one embodiment or another embodiment of the present invention, the flat oval means a figure formed by combination of two semi-circles and two line segments. In addition, the flat circle means a figure obtained by flattening a circle in one direction. Further, the regular polygon constituting the first shape includes rectangles, regular polygons having five or more vertices, rounded-vertex rectangles, and rounded-vertex regular polygons having five or more vertices, while the regular polygon constituting the second shape includes squares, rectangles, regular polygons having five or more vertices, rounded-vertex squares, rounded-vertex rectangles, and rounded-vertex regular polygons having five or more vertices. Incidentally, the shapes in question are not limited to circles and ellipses but may include parabolas and hyperbolas; in other words, the shapes may be figures which can be represented by quadratic or higher-order functions. Further, the shapes include combinations of ellipses with line segments, combinations of parabolas with line segments, and combinations of hyperbolas with line segments. More broadly, the shapes may include combinations of quadratic functions with linear functions, and combinations of third-order or higher-order functions with linear functions.

In addition, the smooth curve portion obtained by curving a central portion of a side constituting a pseudo-rhombic shape in the nonvolatile magnetic memory device according to the first embodiment of the present invention, the smooth curve portion obtained by curving a central portion of an oblique line constituting the pseudo isosceles triangular shape in the nonvolatile magnetic memory device according to the fifth embodiment of the present invention, the central portion of a side having a smooth curve in the nonvolatile magnetic memory device according to the second or sixth embodiment of the present invention, the smooth curve constituting the portion where the visible outline of the first shape and the visible outline of the projected portion intersect in the nonvolatile magnetic memory device according to the third or seventh embodiment of the present invention, and the smooth curve constituting the portion where the visible outline of the first shape and the visible outline of the second shape intersect in the nonvolatile magnetic memory device according to the fourth or eighth embodiment of the present invention, may be provided with smooth recessed and projected portions.

Where the nonvolatile magnetic memory device includes a tunnel magnetoresistance device using the TMR effect and having the above-mentioned structure, the first ferromagnetic material layer more specifically has, for example, a two-layer structure composed of an antiferromagnetic material layer and a ferromagnetic material layer (also called the anchoring layer or magnetization fixation layer), whereby a strong unidirectional magnetic anisotropy can be provided by the exchange interaction between the two layers. Incidentally, the magnetization fixation layer makes contact with the tunnel insulation layer. More specifically, the magnetization fixation layer may have, for example, a multilayer structure (e.g., ferromagnetic material layer/metallic layer/ferromagnetic material layer) having an SAF (Synthetic Antiferromagnet) coupling. The SAF coupling is reported, for example, in S. S. Parkin et al, Physical Review Letters, 7 May, pp.2304-2307 (1990). In the recording layer (second ferromagnetic material layer or free layer), the magnetization direction is rotated comparatively easily. The tunnel insulation film plays the roles of interrupting the magnetic coupling between the recording layer (second ferromagnetic material layer or free layer) and the magnetization fixation layer and passing a tunnel current.

The ferromagnetic material layer (anchoring layer, magnetization fixation layer) and the second ferromagnetic material layer (recording layer, free layer) may include a ferromagnetic material composed of a transition metal magnetic element, specifically, nickel (Ni), iron (Fe) or cobalt (Co), or may include a ferromagnetic material composed mainly of an alloy of these metals (e.g., Co—Fe, Co—Fe—Ni, Ni—Fe, or the like). In addition, a so-called half-metallic ferromagnetic material and an amorphous ferromagnetic material such as CoFe—B may also be used. Examples of the material constituting the antiferromagnetic material layer include iron-manganese alloy, nickel-manganese alloy, platinum-manganese alloy, iridium-manganese alloy, rhodium-manganese alloy, cobalt oxide, and nickel oxide. These layers can be formed, for example, by a physical vapor deposition process (PVD process) exemplified by sputtering process, ion beam build-up process, and vacuum evaporation process.

Examples of the insulation material constituting the tunnel insulation film include aluminum oxide ($AlO_x$), aluminum nitride (AlN), magnesium oxide (MgO), magnesium nitride, silicon oxide, and silicon nitride, and further include Ge, NiO, $CdO_x$, $HfO_2$, $Ta_2O_5$, BN, and ZnS. The tunnel insulation film can be obtained, for example, by a method in which a metallic film formed by the sputtering process is oxidized or nitrided. More specifically, where aluminum oxide ($AlO_x$) is used as the insulation material constituting the tunnel insulation film, examples of the method usable include a method in which aluminum formed by the sputtering process is oxidized in air, a method in which aluminum formed by the sputtering process is subjected to plasma oxidation in air, a method in which aluminum formed by the sputtering process is oxidized by use of an IPC plasma, a method in which aluminum formed by the sputtering process is subjected to spontaneous oxidation in oxygen, a method in which aluminum formed by the sputtering process is oxidized by use of oxygen radicals, a method in which aluminum formed by the sputtering process is subjected to spontaneous oxidation in oxygen while irradiating with UV rays, a method in which a film of aluminum is formed by the reactive sputtering process, and a method in which a film of aluminum oxide is formed by the sputtering process. Alternatively, the tunnel insulation film may be formed by the ALD (Atomic Layer Deposition) process.

The patterning of the laminate structure can be conducted, for example, by the reactive ion etching (RIE) process or the ion milling process (ion beam etching process). In some cases, the patterning can be conducted by the so-called lift-off process.

The write word line and the bit line may be formed, for example, of aluminum, an aluminum-based alloy (e.g., Al—Cu), or copper (Cu), and can be formed, for example, a PVD process exemplified by the sputtering process.

The contact hole may be formed of polysilicon doped with an impurity or a high-melting-temperature metal or metal silicide such as tungsten, Ti, Pt, Pd, Cu, TiW, TiNW, $WSi_2$, $MoSi_2$, etc., and can be formed by the chemical vapor deposition process (CVD process) or a PVD process exemplified by the sputtering process.

The selection transistor may be composed, for example, of a known MISFET or MOSFET.

Examples of the materials for constituting the interlayer insulation layer, the lower interlayer insulation layer and the upper interlayer insulation layer include silicon oxide ($SiO_2$), silicon nitride (SiN) SiON, SOG, NSG, PBSG, PSG, BSG, and LTO.

The plan-view shape of the recording layer in the nonvolatile magnetic memory devices according to the first to eighth embodiments of the present invention is made to be of the Saturn type, whereby the dispersion of the switching magnetic field $H_{Switch}$ can be reduced, though the reason has not been elucidated. Particularly, even where the magnetoresistance device is damaged due to the dispersion in the lithography step, the processing dispersion in the case of adopting an etching process such as the RIE process and the ion milling process, or etching or an after-treatment (e.g., cleaning treatment in the case of using a chlorine-based gas for etching), the dispersion of the switching magnetic field $H_{Switch}$ can be largely reduced. As a result, an asteroid characteristic with a large writing operation window, for example, can be obtained, so that it is possible to suppress the dispersions between the nonvolatile magnetic memory devices, and to realize a nonvolatile magnetic memory device which is high in performance and the degree of integration.

In the photomask according to the one embodiment or another embodiment of the present invention, the pattern formed in the photomask includes a combination of the first shape and the second shape, the designing of the pattern to be formed in the photomask can be carried out with a high degree of freedom, for obtaining the recording layer having a desired plan-view shape. What kind of pseudo-rhombic shape or pseudo isosceles triangular shape can be obtained depending on the combination of the size and shape of the first shape with the size and shape of the second shape can be determined and evaluated by conducting a variety of simulations or by actually forming a pattern in a photomask and patterning the recording layer on the basis of the photomask.

BRIEF DESCRIPTION OF THE DRAWINGS

FIG. 6 is a schematic partly sectional view of the nonvolatile magnetic memory device of the TMR type in Example 1;

DETAILED DESCRIPTION OF THE PREFERRED EMBODIMENTS

Figure 1:
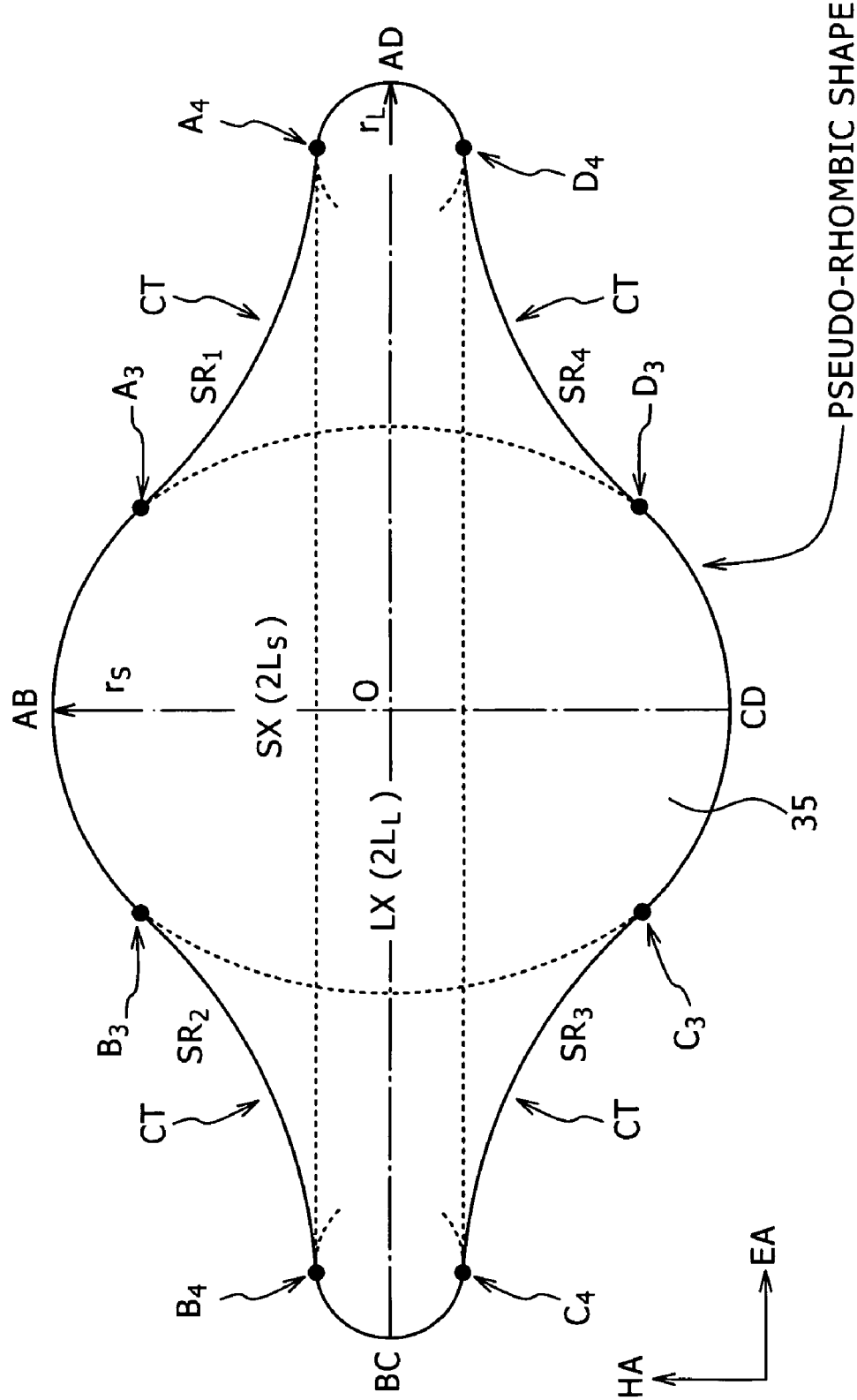
FIG. 1 is a schematic plan view of a recording layer in a nonvolatile magnetic memory device in Example 1 as the nonvolatile magnetic memory device according to the first embodiment of the present invention.

Now, the present invention will be described below based on Examples, referring to the drawings.

EXAMPLE 1

Example 1 pertains to a nonvolatile magnetic memory device according to the first to fourth embodiments of the present invention. The nonvolatile magnetic memory device in Example 1 including a magnetoresistance device having a recording layer being formed of a ferromagnetic material for storing information by use of variation in resistance depending on the magnetization inversion state thereof, and is specifically a nonvolatile magnetic memory device including a tunnel magnetoresistance device using the TMR effect.

Here, in the nonvolatile magnetic memory device in Example 1 as the nonvolatile magnetic memory device according to the first embodiment of the present invention, as a schematic plan view of a recording layer 35 is shown in FIG. 1, the plan-view shape (indicated by solid lines) of the recording layer 35 has a pseudo rhombic shape having four sides $SR_m$ (where "m" is any of 1, 2, 3, and 4). The sides $SR_m$ indicate the portions of the plan-view shape of the recording layer 35 which are located between the intersections BC, AD of the plan-view shape of the recording layer 35 with the longer axis LX (length: $2L_L$) of the pseudo rhombic shape and the intersections AB, CD of the plan-view shape of the recording layer 35 with the shorter axis SX (length: $2L_S$) of the pseudo-rhombic shape. At least two of the four sides constituting the pseudo-rhombic shape (in Example 1, all the four sides $SR_m$) each have a smooth curve having a central portion CT thereof curved toward the center of the pseudo-rhombic shape. The easy axis of magnetization (EA) of the recording layer 35 is substantially parallel to the longer axis LX (indicated by dot-dash line) of the pseudo-rhombic shape, and the hard axis of magnetization (HA) of the recording layer 35 is substantially parallel to the shorter axis SX (indicated by dot-dash line) of the pseudo-rhombic shape. Further, the sides $SR_m$ constituting the plan-view shape of the recording layer 35 are smoothly connected to each other.

Incidentally, at least two points of inflection are present in each of the sides $SR_m$ each of which has the smooth curve having a central portion CT thereof curved. Specifically, two inflection points ($A_3, A_4$) are present in the side $SR_1$, and two inflection points ($B_3, B_4$) are present in the side $SR_2$. Further, two inflection points ($C_3, C_4$) are present in the side $SR_3$, and two inflection points ($D_3, D_4$) are present in the side $SR_4$. Incidentally, in the drawing, the points of inflection are represented by solid circle.

Here, as shown in FIG. 1, the plan-view shape of the recording layer 35 is substantially line symmetric with respect to the shorter axis SX of the pseudo-rhombic shape, and is substantially line symmetric with respect also to the longer axis LX of the pseudo-rhombic shape.

Figure 2:
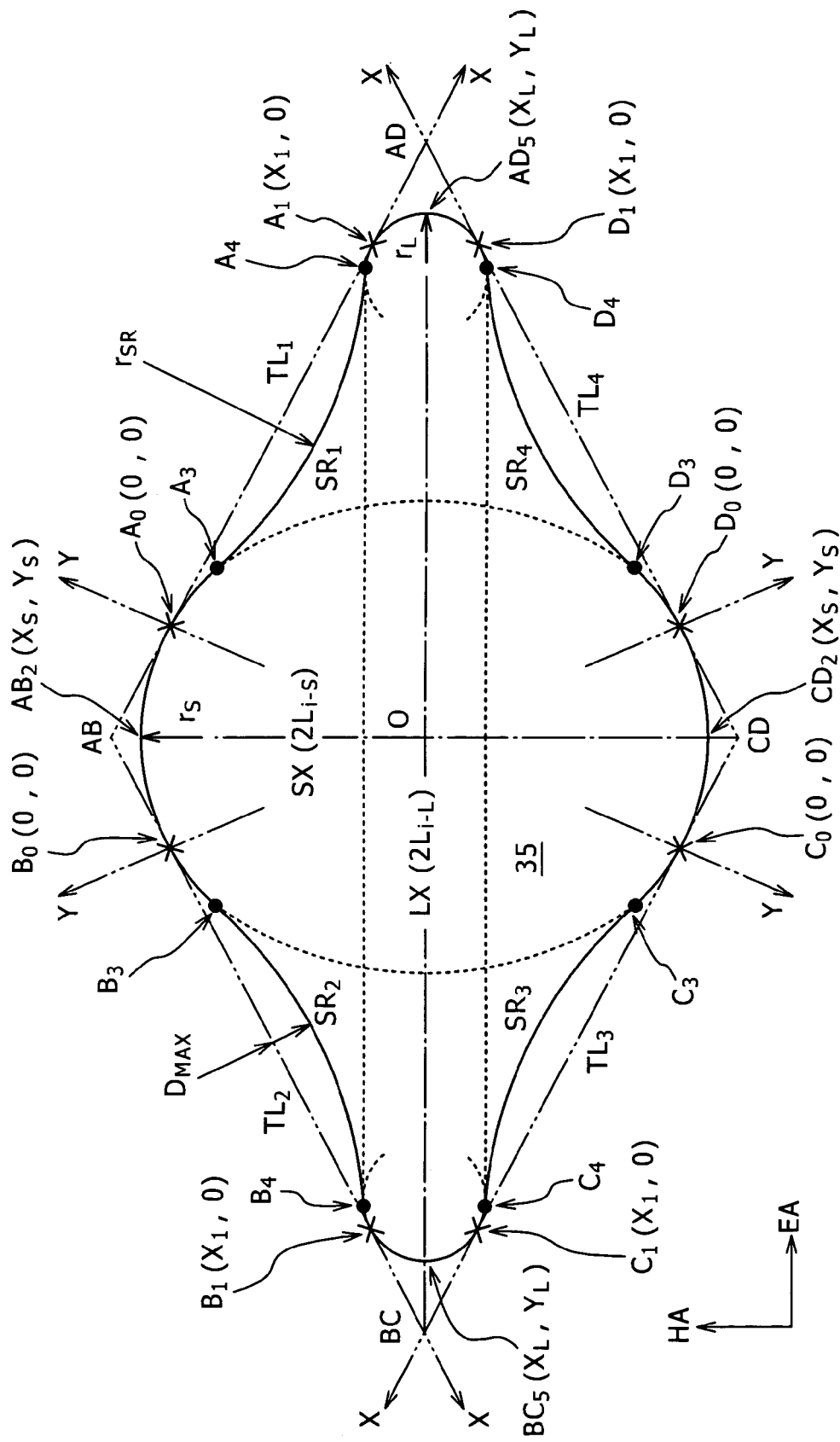
FIG. 2 is a schematic plan view of a recording layer in a nonvolatile magnetic memory device in Example 1 as the nonvolatile magnetic memory device according to the second embodiment of the present invention.

Alternatively, in the nonvolatile magnetic memory device in Example 1 as the nonvolatile magnetic memory device according to the second embodiment of the present invention, as a schematic plan view of the recording layer 35 is shown in FIG. 2, the plan-view shape (indicated by solid line) of the recording layer 35 include fourth sides $SR_m$, and at least two of the four sides (in Example 1, all the four sides $SR_m$) are each composed of a smooth curve. Besides, the plan-view shape of the recording layer 35 is inscribed in a virtual rhombus (indicated by two-dotted chain lines). In FIG. 2, the inscribing points are represented by mark "x". Here, the virtual rhombus has a longer axis LX having a length (the distance from point AD to point BC) of $2L_{i-L}$, and a shorter axis SX orthogonally intersecting the longer axis LX at the bisection point O of the longer axis LX and having a length (the distance from point AB to point CD) of $2L_{i-s}$ [where $L_{i-S} < L_{i-L}$]; the longer axis LX is substantially parallel to the easy axis (EA) of the recording layer 35, and the shorter axis SX is substantially parallel to the hard axis (HA) of the recording layer 35. Further, each of the sides $SR_m$ having smooth curves, contacts the corresponding side $TL_m$ of the virtual rhombus at at least two points (just two points in Example 1). In FIG. 2, the points of contact are represented by mark "x". In addition, the sides $SR_m$ constituting the plan-view shape of the recording layer 35 are smoothly connected to each other.

In the side $SR_1$ having a smooth curve for constituting the plan-view shape of the recording layer 35, (a) the point located closest to the shorter axis SX of the virtual rhombus, of the at least two points of contact with the side $TL_1$ of the virtual rhombus, is made to be the origin $A_0$ (0, 0) of a Gaussian coordinate system, (b) the point located closest to the longer axis LX of the virtual rhombus, of the at least two points of contact with the side $TL_1$ of the virtual rhombus, is made to be $A_1$ ($X_1$, 0) [where $X_1>0$], (c) the intersection with the shorter axis SX of the virtual rhombus is made to be $AB_2$ ($X_S, Y_S$) [where $X_S<0, Y_S<0$], and (d) the intersection with the longer axis LX of the virtual rhombus is made to be $AD_5$ ($X_L, Y_L$) [where $X_L>0, Y_L<0$].

Further, the side $SR_1$ is expressed by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient at each point in the interval $X_S<X<X_L$, and the real variable function F(X) has two points of inflection ($A_3, A_4$) in the interval $0<X<X_1$.

More specifically, in the interval $X_S<X \leq X_{A3}$ ($X_{A3}$ is the X-coordinate of the inflection point $A_3$), the real variable function F(X) is represented by a circle with a radius $r_S$. Besides, in the interval $X_{A3} \leq X \leq X_{A4}$ ($X_{A4}$ is the X-coordinate of the inflection point $A_4$), the real variable function F(X) is represented by a circle with a radius $r_{SR}$. Further, in the interval $X_{A4}<X \leq X_L$, the real variable function F(X) is represented by a circle with a radius $r_L$.

In addition, in the side $SR_2$ composed of a smooth curve for constituting the plan-view shape of the recording layer 35, (a) the point located closest to the shorter axis SX of the virtual rhombus, of the at least two points of contact with the side $TL_2$ of the virtual rhombus, is made to be the origin $B_0$ (0, 0) of a Gaussian coordinate system, (b) the point located closest to the longer axis LX of the virtual rhombus, of the at least two points of contact with the side $TL_2$ of the virtual rhombus, is made to be $B_1$ ($X_1$, 0) [where $X_1>0$], (c) the intersection with the shorter axis SX of the virtual rhombus is made to be $AB_2$ ($X_S, Y_S$) [where $X_S<0, Y_S<0$], and (d) the intersection with the longer axis LX of the virtual rhombus is made to be $BC_5$ ($X_L, Y_L$) [where $X_L>0, Y_L<0$].

Further, the side $SR_2$ is represented by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient in each point in the interval $X_S<X<X_L$, and the real variable function F(X) has two points of inflection ($B_3, B_4$) in the interval $0<X<X_1$.

More specifically, in the interval $X_S<X \leq X_{B3}$ ($X_{B3}$ is the X-coordinate of the inflection point $B_3$), the real variable function F(X) is represented by a circle with a radius $r_S$. Besides, in the interval $X_{B3} \leq X \leq X_{B4}$ ($X_{B4}$ is the X-coordinate of the inflection point $B_4$), the real variable function F(X) is represented by a circle with a radius $r_{SR}$. Further, in the interval $X_{B4}<X \leq X_L$, the real variable function F(X) is represented by a circle with a radius $r_L$.

Besides, in the side $SR_3$ composed of a smooth curve for constituting the plan-view shape of the recording layer 35, (a) the point located closest to the shorter axis SX of the virtual rhombus, of the at least two points of contact with the side $TL_3$ of the virtual rhombus, is made to be the origin $C_0$ (0, 0) of a Gaussian coordinate system, (b) the point located closest to the longer axis LX of the virtual rhombus, of the at least two points of contact with the side $TL_3$ of the virtual rhombus, is made to be $C_1$ ($X_1$, 0) [where $X_1>0$], (c) the intersection with the shorter axis SX of the virtual rhombus is made to be $CD_2$ ($X_S, Y_S$) [where $X_S<0, Y_S<0$], and (d) the intersection with the longer axis LX of the virtual rhombus is made to be $BC_5$ ($X_L, Y_L$) [where $X_L>0, Y_L<0$].

Further, the side $SR_3$ is expressed by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient at each point in the interval $X_S<X<X_L$, and the real variable function F(X) has two points of inflection ($C_3, C_4$) in the interval $0<X<X_1$.

More specifically, in the interval $X_S<X \leq X_{C3}$ ($X_{C3}$ is the X-coordinate of the inflection point $C_3$), the real variable function F(X) is represented by a circle with a radius $r_S$. Besides, in the interval $X_{C3} \leq X \leq X_{C4}$ ($X_{C4}$ is the X-coordinate of the inflection point $C_4$), the real variable function F(X) is represented by a circle with a radius $r_{SR}$. Further, in the interval $X_{C4}<X \leq X_L$, the real variable function F(X) is represented by a circle with a radius $r_L$.

In addition, in the side $SR_4$ composed of a smooth curve for constituting the plan-view shape of the recording layer 35, (a) the point located closest to the shorter axis SX of the virtual rhombus, of the at least two points of contact with the side $TL_4$ of the virtual rhombus, is made to be the origin $D_0$ (0, 0) of a Gaussian coordinate system, (b) the point located closest to the longer axis LX of the virtual rhombus, of the at least two points of contact with the side $TL_4$ of the virtual rhombus, is made to be $D_1$ ($X_1$, 0) [where $X_1>0$], (c) the intersection with the shorter axis SX of the virtual rhombus is made to be $CD_2$ ($X_S, Y_S$) [where $X_S<0, Y_S<0$], and (d) the intersection with the longer axis LX of the virtual rhombus is made to be $AD_5$ ($X_L, Y_L$) [where $X_L>0, Y_L<0$]

Further, the side $SR_4$ is expressed by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient at each point in the interval $X_S<X<X_L$, and the real variable function F(X) has two points of inflection ($D_3, D_4$) in the interval $0<X<X_1$.

More specifically, in the interval $X_S<X \leq X_{D3}$ ($X_{D3}$ is the X-coordinate of the inflection point $D_3$), the real variable function F(X) is represented by a circle with a radius $r_S$. Besides, in the interval $X_{D3} \leq X \leq X_{D4}$ ($X_{D4}$ is the X-coordinate of the inflection point $D_4$), the real variable function F(X) is represented by a circle with a radius $r_{SR}$. Further, in the interval $X_{D4}<X \leq X_L$, the real variable function F(X) is represented by a circle with a radius $r_L$.

Incidentally, in the interval $X_S<X<0$, the first-order differential coefficient of the real variable function F(X) is a positive value; at X=0, the first-order differential coefficient of the real variable function F(X) is 0; and in the interval $0<X<X_1$, the first-order differential coefficient of the real variable function F(X) varies from a negative value to 0, and further to a positive value. At X=$X_1$, the first-order differential coefficient of the real variable function F(X) is 0; and in the interval $X_1<X<X_L$, the first-order differential coefficient of the real variable function F(X) is a negative value.

Furthermore, in the interval $X_S<X<X_{A3}$ (or $X_{B3}$, $X_{C3}$, $X_{D3}$), the second-order differential coefficient of the real variable function F(X) is a negative value; at $X=X_{A3}$ (or $X_{B3}$, $X_{C3}$, $X_{D3}$), the second-order differential coefficient of the real variable function F(X) is 0; in the interval $X_{A3}$ (or $X_{B3}$, $X_{C3}$, $X_{D3}$)$<X<X_{A4}$ (or $X_{B4}$, $X_{C4}$, $X_{D4}$), the second-order differential coefficient of the real variable function F(X) is positive; and in the interval $X=X_{A4}$ (or $X_{B4}$, $X_{C4}$, $X_{D4}$), the second-order differential coefficient of the real variable function F(X) is a negative value.

In addition, assuming a Gaussian coordinate system with the longer axis LX of the virtual rhombus being the x-axis and with the shorter axis SX of the virtual rhombus being the y-axis, when the side $SR_1$ and the side $SR_2$ are collectively expressed by a real variable function f(x) and the side $SR_3$ and the side $SR_4$ are collectively expressed by the real variable function f(x), the real variable function f(x) has a continuous differential coefficient at each point in the interval a<x<b (where a is the minimum allowable value of x in the real variable function f(x), and b is the maximum allowable value of x in the real variable function f(x)). Besides, the first-order differential coefficient of the real variable function f(x) at x=0 is 0, and the first-order differential coefficient of the real variable function f(x) at y=0 is ∞.

In the recording layer 35 shown in FIG. 2, also, the plan-view shape is substantially line symmetric with respect to the shorter axis SX of the virtual rhombus, and is substantially line symmetric with respect also to the longer axis LX of the virtual rhombus.

Figure 3:
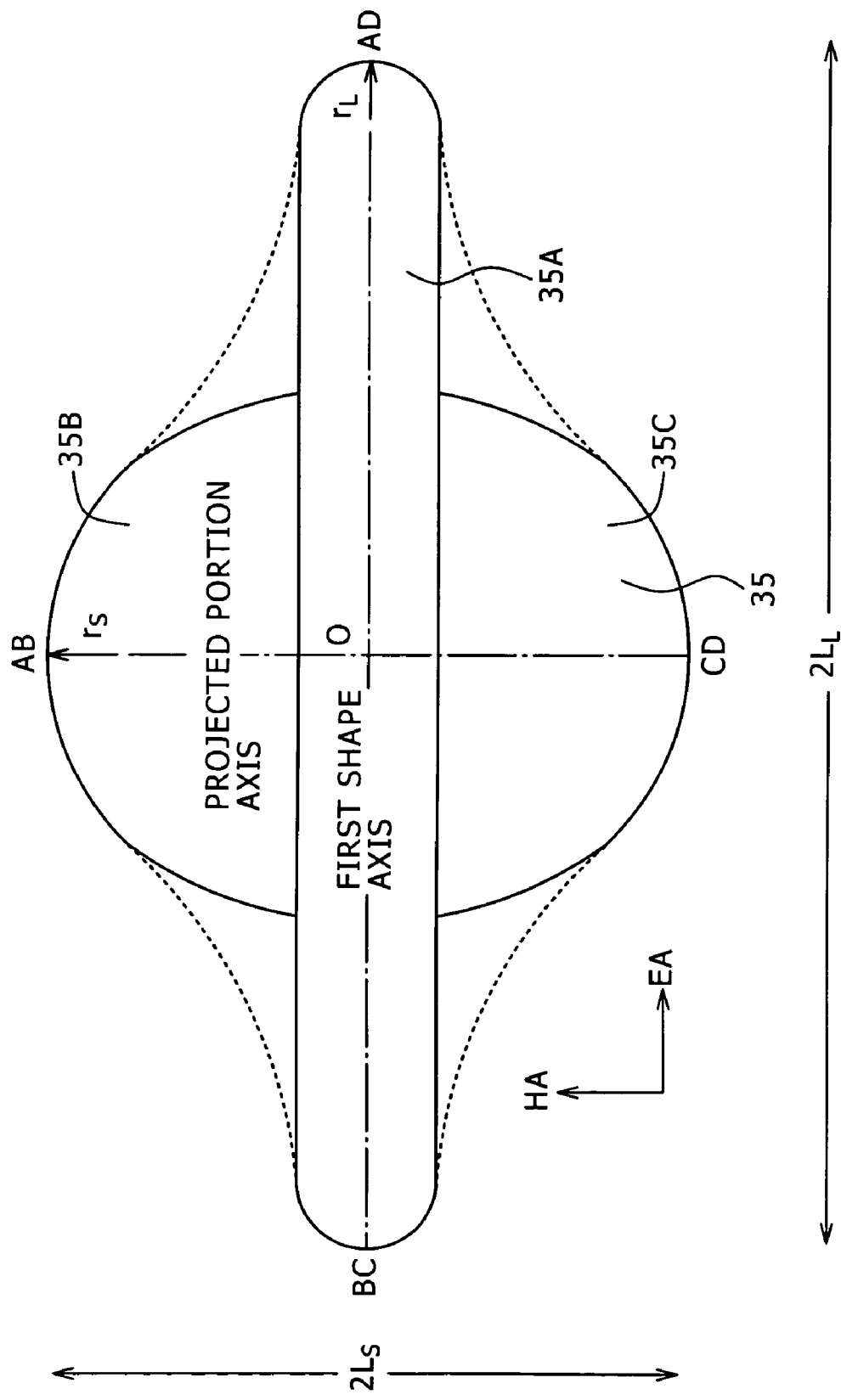
FIG. 3 is a schematic plan view of a recording layer in a nonvolatile magnetic memory device in Example 1 as the nonvolatile magnetic memory device according to the third embodiment of the present invention.

Alternatively, in the nonvolatile magnetic memory device in Example 1 as the nonvolatile magnetic memory device according to the third embodiment of the present invention, as the schematic plan view of the recording layer 35 is shown in FIG. 3, the plan-view shape of the recording layer 35 includes a first shape 35A (indicated by solid line in FIG. 3), and two projected portions 35B, 35C (indicated by solid lines in FIG. 3) projected from the first shape 35A. The two projected portions 35B, 35C are located on the projected portion axis (indicated by dot-dash line in FIG. 3). Here, the projected portion axis passes through the center O of the first shape 35A, and orthogonally intersects the first shape axis (indicated by dot-dash line in FIG. 3) passing through the center O of the first shape 35A. In addition, the easy axis (EA) of the recording layer 35 is substantially parallel to the first shape axis, and the hard axis (HA) of the recording layer 35 is substantially parallel to the projected portion axis. Further, let the length of the first shape 35A along the first shape axis be $2L_L$, and let the distance between tip end portions of the two projected portions 35B and 35C along the projected portion axis be $2L_S$, then the relationship $L_L>L_S$ is satisfied. In addition, each of the portions where the visible outline of the first shape 35A intersects the visible outlines of the projected portions 35B, 35C has a smooth curve (indicated by broken line in FIG. 3) curved toward the center O of the first shape 35A.

The first shape 35A is a flat oval, i.e., a figure composed of a combination of two semi-circles (radius: $r_L$) with two line segments. In addition, the projected portions 35B and 35C are each a figure composed of a part of a circle (radius: $r_S$).

Incidentally, the plan-view shape of the recording layer 35 is substantially line symmetric with respect to the projected portion axis, and is substantially line symmetric with respect to the first shape axis.

Figure 4:
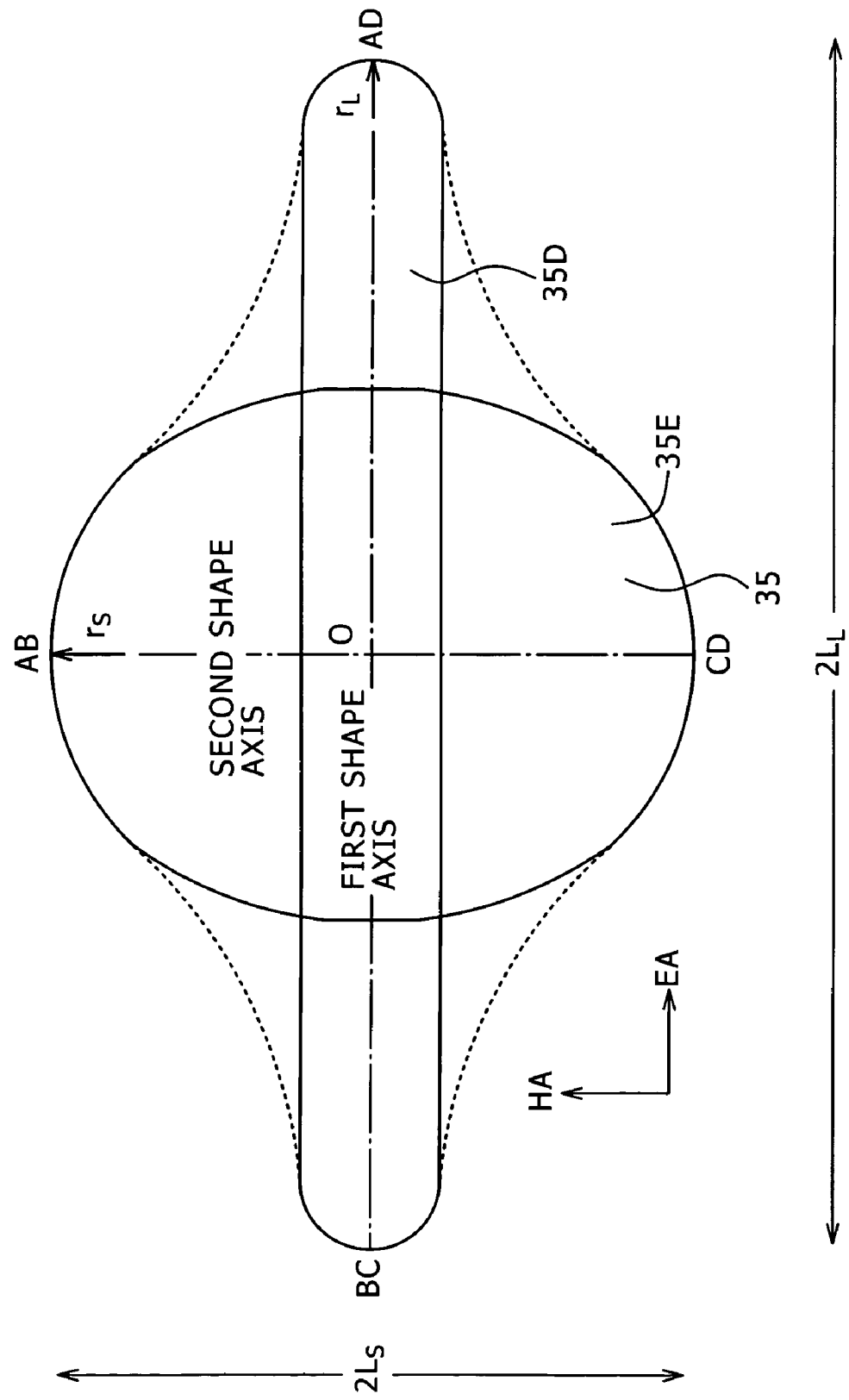
FIG. 4 is a schematic plan view of a recording layer in a nonvolatile magnetic memory device in Example 1 as the nonvolatile magnetic memory device according to the fourth embodiment of the present invention.

Alternatively, in the nonvolatile magnetic memory device in Example 1 as the nonvolatile magnetic memory device according to the fourth embodiment of the present invention, as the schematic plan view of the recording layer 35 is shown in FIG. 4, the plan-view shape of the recording layer 35 has a superposed shape in which a first shape 35D and a second shape 35E having a center O coinciding with the center O of the first shape 35D are superposed on each other so that the second shape 35E is projected from the first shape 35D at two positions. The first shape axis passing through the center O of the first shape 35D and the second shape axis passing through the center O of the second shape 35E orthogonally intersect each other. Further, the easy axis (EA) of the recording layer 35 is substantially parallel to the first shape axis, and the hard axis (HA) of the recording layer 35 is substantially parallel to the second shape axis. Besides, let the length of the first shape 35D along the first shape axis be $2L_L$, and let the length of the second shape 35E along the second shape axis be $2L_S$, then the relationship $L_L>L_S$ is satisfied. Further, each of the portions where the visible outline of the first shape 35D and the visible outline of the second shape 35E intersect is composed of a smooth curve (indicated by broken line in FIG. 4) curved toward the center O of the first shape 35D.

The first shape 35D is a flat oval, i.e., a figure composed of a combination of two semi-circles (radius: $r_L$) with two line segments. In addition, the second shape 35E is also a flat oval, i.e., a figure composed of a combination of two semi-circles (radius: $r_S$) with two line segments.

Incidentally, the recording layer 35 is substantially line symmetric with respect to the second shape axis, and is substantially line symmetric with respect to the first shape axis.

As a schematic partly sectional view is shown in FIG. 6, one tunnel magnetoresistance device TMJ in Example 1 has a laminate structure in which a first ferromagnetic material layer 31, a tunnel insulation film 34 formed of $AlO_x$, and a second ferromagnetic material layer 35 (also called free layer or recording layer) formed of a Ni—Fe alloy are provided in this order from the lower side. The first ferromagnetic material layer 31 has a laminate structure of an antiferromagnetic material layer 32 and a magnetization fixation layer 33. The magnetization fixation layer 33 may have a multilayer structure (e.g., ferromagnetic material layer/metal layer/ferromagnetic material layer) having the synthetic antiferromagnet (SAF) coupling, and, more specifically, has a three-layer structure in which a Co—Fe layer, a Ru layer, and a Co—Fe layer are provided in this order from the lower side. The magnetization fixation layer 33 undergoes exchange coupling with the antiferromagnetic material layer 32, whereby pinning of the magnetization direction is effected. The magnetization direction of the second ferromagnetic material layer (recording layer) 35 is changed to be parallel to or anti-parallel to the magnetization fixation layer 33, by a magnetic field applied externally. The first ferromagnetic material layer 31 is electrically insulated from a write word line RWL through a lower interlayer insulation layer 24. Here, the write word line RWL extends in a first direction (the direction perpendicular to the paper surface of the drawing). On the other hand, the second ferromagnetic material layer 35 is electrically connected to a bit line BL, through a top coat film 36 formed of copper (Cu), tantalum (Ta), titanium (Ti), tungsten (W), TiN, TaN, WN, or the like. The top coat film 36 is in charge of prevention of mutual diffusion of the atoms constituting the bit line BL and the atoms constituting the ferromagnetic material layer (recording layer) 35, reduction of the contact resistance, and prevention of the oxidation of the ferromagnetic material layer (recording layer) 35. An upper interlayer insulation layer 26 covers the tunnel magnetoresistance device TMJ and the lower interlayer insulation layer 24. The bit line BL is formed on the upper interlayer insulation layer 26, and extends in a second direction (the left-right direction in the drawing) which is different from (specifically, orthogonal to) the first direction. In FIG. 6, reference numeral 37 denotes an extraction electrode connected to the lower surface of the antiferromagnetic material layer 32.

A selection transistor TR composed of a MOSFET is formed on a semiconductor substrate 10. More specifically, the selection transistor TR is formed in an active region surrounded by device isolation regions 11, and includes a gate electrode 12, a gate insulation film 13, and source/drain regions 14A, 14B. An interlayer insulation layer 21 formed of $SiO_2$, for example, covers the selection transistor TR. A contact hole 22 formed of a tungsten plug is formed in an opening portion provided in the interlayer insulation layer 21, and is connected to the source/drain region 14B on one side of the selection transistor TR. The contact hole 22 is connected further to a landing pad portion 23 formed on the interlayer insulation layer 22. A write word line RWL formed of an Al—Cu alloy is also formed on the interlayer insulation layer 21. The lower interlayer insulation layer 24 is formed on the write word line RWL and the interlayer insulation layer 21. The extraction electrode 37 is formed on the lower interlayer insulation layer 24, and the extraction electrode 37 is connected to the landing pad portion 23, through the contact hole 25 formed of the tungsten plug provided in the lower interlayer insulation layer 24. Incidentally, the source/drain region 14A on the other side of the selection transistor TR is connected to a sense line 16 through a contact hole 15.

In some cases, the selection transistor TR may be unnecessary.

Now, a method of manufacturing an MRAM in Embodiment 1 will be described below, referring to FIGS. 7A to 7C and FIGS. 8A and 8B, which are schematic partly sectional views of the lower interlayer insulation layer 24 and the like. Incidentally, in FIGS. 7A to 7C and FIGS. 8A and 8B, the selection transistor TR and the like are omitted.

[Step 100]

First, a MOSFET functioning as the selection transistor TR is formed on a semiconductor substrate 10 composed of a silicon semiconductor substrate. For this purpose, device separation regions 11 having a trench structure, for example, are formed based on the known method. Incidentally, the device separation regions may have a LOCOS structure or may have a combination of the LOCOS structure and the trench structure. Thereafter, the surface of the semiconductor substrate 10 is oxidized, for example, by the pyrogenic process, to form a gate insulation film 13. Next, a polysilicon layer doped with an impurity is formed on the entire surface by a CVD process, and the polysilicon layer is patterned, to form a gate electrode 12. Incidentally, the gate electrode 12 may not necessarily be composed of a polysilicon layer, and may be composed of a polycide or metal silicide. Next, ions are implanted into the semiconductor substrate 10, to form an LDD structure (not shown). Thereafter, an $SiO_2$ layer is formed on the entire surface by a CVD process, and the $SiO_2$ layer is etched back, to form a gate side wall (not shown) at the side surface of the gate electrode 12. Next, ions are implanted into the semiconductor substrate 10, followed by an activation annealing treatment for the impurity thus ion-implanted, to form source/drain regions 14A and 14B.

Next, a lower layer of the interlayer insulation layer composed of $SiO_2$ is formed on the whole surface by a CVD process, and the lower layer of the interlayer insulation layer is polished by a chemical mechanical polishing process (CMP process). Thereafter, an opening portion is formed in the lower layer of the interlayer insulation layer on the upper side of the source/drain region 14A on the basis of the lithography technology and the RIE process, and then a polysilicon layer doped with an impurity is formed on the lower layer of the interlayer insulation layer inclusive of the inside of the opening portion by a CVD process. Next, the polysilicon layer on the lower layer of the interlayer insulation layer is patterned, whereby a sense line 16 can be formed on the lower layer of the interlayer insulation layer. The sense line 16 and the source/drain region 14A are connected to each other through a contact hole 15 formed in the lower layer of the interlayer insulation layer. Thereafter, an upper layer of the interlayer insulation layer which is composed of BPSG is formed on the entire surface by a CVD process. Incidentally, it is preferable that, after the formation of the upper layer of the interlayer insulation layer composed of the BPSG, a heat treatment in a nitrogen atmosphere under the conditions of 900° C.×20 min, for example, is conducted for reflowing of the upper layer of the interlayer insulation layer. Further, if necessary, it is preferable that the top surface of the upper layer of the interlayer insulation layer is chemically and mechanically polished by the CMP process, for example, to planarize the upper layer of the interlayer insulation layer, or the resist etch-back process is carried out to planarize the upper layer of the interlayer insulation layer. Incidentally, the lower layer of the interlayer insulation layer and the upper layer of the interlayer insulation layer will hereinafter be referred to simply as the interlayer insulation layer 21.

[Step 120]

Thereafter, an opening portion is formed in the interlayer insulation layer 21 on the upper side of the source/drain region 14B by an RIE process, and then a contact hole 22 connected to the source/drain region 14B of the selection transistor TR is formed in the opening portion. The top surface of the contact hole 22 is substantially flush with the surface of the interlayer insulation layer 21. The opening portion is filled with tungsten by a blanket tungsten CVD process, whereby the contact hole 22 can be formed. Incidentally, it is preferable that, before filling the opening portion with tungsten, a Ti layer and a TiN layer are sequentially formed on the interlayer insulation layer 21 inclusive of the inside of the opening portion by a magnetron sputtering process, for example. Here, the Ti layer and the TiN layer are formed for the purposes of obtaining an ohmic low contact resistance, preventing damages from being generated in the semiconductor substrate 10 during the blanket tungsten CVD process, and enhancing the adhesion of tungsten. In the drawings, the Ti layer and the TiN layer are omitted. The tungsten layer, the TiN layer and the Ti layer on the interlayer insulation layer 21 may be removed by the chemical mechanical polishing process (CMP process). Besides, polysilicon doped with an impurity may be used, in place of tungsten. Thereafter, a write word line RWL and a landing pad portion 23 are formed on the interlayer insulation layer 21 by a known method.

[Step 130]

Thereafter, a lower interlayer insulation layer 24 is formed on the entire surface. Specifically, the lower interlayer insulation layer 24 formed of $SiO_2$ is formed on the interlayer insulation layer 21 inclusive of the write word line RWL and the landing pad portion 23, based on an HDP (High Density Plasma) CVD process, and then the lower interlayer insulation layer 24 is subjected to a planarizing treatment. Thereafter, an opening portion is provided in the portion of the lower interlayer insulation layer 24 on the upper side of the landing pad portion 23, and the opening portion is filled with tungsten by the blanket tungsten CVD process, whereby a contact hole 25 can be formed.

[Step 140]

Next, for forming an extraction electrode 37 on the lower interlayer insulation layer 24, a Ta layer 37A having a thickness of 10 nm is formed by a sputtering process. Exemplary conditions for formation of the Ta layer 37A are given in Table 1 below.

[Step 150]

Thereafter, a first ferromagnetic material layer 31 (an antiferromagnetic material layer 32 formed of a Pt—Mn alloy with a thickness of 20 nm, and a magnetization fixation layer 33 having a three-layer structure of a Co—Fe layer, a Ru layer, and a Co—Fe layer in this order from the lower side, and having SAF), a tunnel insulation film 34 formed of $AlO_x$, a recording layer (second ferromagnetic material layer) 35, and a top coat film 36 are sequentially formed on the entire surface. Exemplary conditions for formation of these layers are given in Tables 2 to 6 below. In this manner, the structure shown in FIG. 7A can be obtained.

TABLE 1

Conditions for Formation of 10 nm-thick Ta Layer

| Process gas: | argon = 100 sccm |
|---|---|
| Atmospheric pressure: | 0.6 Pa |
| DC power: | 200 W |

TABLE 2

Conditions for Formation of 20 nm-thick Pt—Mn Alloy Antiferromagnetic Material Layer 32

| Process gas: | argon = 100 sccm |
|---|---|
| Atmospheric pressure: | 0.6 Pa |
| DC power: | 200 W |

TABLE 3

Conditions for Formation of Magnetization Fixation Layer 33

| Lowermost layer: | 2 nm-thick Co—Fe alloy layer |
|---|---|
| Process gas: | argon = 50 sccm |
| Atmospheric pressure: | 0.3 Pa |
| DC power: | 100 W |
| Intermediate layer: | 1 nm-thick Ru layer |
| Process gas: | argon = 50 sccm |
| Atmospheric pressure: | 0.3 Pa |
| DC power: | 50 W |
| Uppermost layer: | 2 nm-thick Co—Fe alloy layer |
| Process gas: | argon = 50 sccm |
| Atmospheric pressure: | 0.3 Pa |
| DC power: | 100 W |

TABLE 4

Conditions for Formation of $AlO_x$ Tunnel Insulation Film

Formation of 1 to 2 nm-thick Al film

| Process gas: | argon = 50 sccm |
|---|---|
| Atmospheric pressure: | 0.3 Pa |
| DC power: | 50 W |

Oxidation of Al film

| Gas used: | oxygen = 10 sccm |
|---|---|
| Atmospheric pressure: | 0.3 Pa |

TABLE 5

Conditions for Formation of 5 nm-thick Co—Fe Alloy Recording Layer 35

| Process gas: | argon = 50 sccm |
|---|---|
| Atmospheric pressure: | 0.3 Pa |
| DC power: | 200 W |

TABLE 6

Conditions for Formation of 100 nm-thick TiN Top coat film 36

| Process gas: | argon = 65 sccm |
|---|---|
| Atmospheric pressure: | 0.3 Pa |
| DC power: | 10 kW |

[Step 160]

Thereafter, a hard mask layer for etching is formed on the top coat film 36. The hard mask layer has a two-layer structure including an SiN layer 40 and an $SiO_2$ layer 41 in this order from the lower side. Examples of other materials for constituting the hard mask layer include SiC and SiON. The hard mask layer may be of a single-layer configuration. In some cases, the hard mask layer is formed to also have the functions of preventing reflection in the lithography step, stopping etching, preventing diffusion of metal, and so on. Here, as an example, a 50 nm-thick SiN layer 40 is formed by use of a parallel flat plate electric power plasma CVD apparatus, and the $SiO_2$ layer 41 is formed by use of a bias high-density plasma CVD (HDP-CVD) apparatus. Exemplary conditions for formation of these layers are given in Tables 7 and 8 below.

TABLE 7

Conditions for Formation of SiN Layer

| Process gas: | monosilane/ammonia/$N_2$ = 260 sccm/100 sccm/4000 sccm |
|---|---|
| Pressure: | 565 Pa |

TABLE 8

Conditions for Formation of $SiO_2$ Layer

| Process gas: | monosilane/$O_2$/argon = 60 sccm/120 sccm/130 sccm |
|---|---|
| RF power | |
| Top: | 1.5 kW |
| Side: | 3 kW |

[Step 170]

Next, a resist material is applied to the whole surface, and then a resist film 42 to be a mask for forming a tunnel magnetoresistance device is formed on the hard mask layer by a lithography technique. In this manner, the structure shown in FIG. 7B can be obtained.

[Step 180]

Then, the $SiO_2$ layer 41 constituting the hard mask layer is patterned by a reactive ion etching process using the resist film 42 as a mask. Exemplary etching conditions in this case are given in Table 9 below. Thereafter, the resist film 42 is removed by an oxygen plasma ashing treatment and an organic cleaning after-treatment. Next, the SiN layer 40 constituting the hard mask layer is etched by a reactive ion etching process using the $SiO_2$ layer 41 as a mask. Exemplary etching conditions in this case are given in Table 10 below. In this manner, the structure shown in FIG. 7C can be obtained.

TABLE 9

Etching Conditions for SiO$_2$ Layer

| | |
|---|---|
| Gas used: | C$_4$F$_8$/CO/Ar/O$_2$ = |
| | 10 sccm/50 sccm/200 sccm/4 sccm |
| RF power: | 1 kW |
| Pressure: | 5 Pa |
| Temperature: | 20° C. |

TABLE 10

Etching Conditions for SiN Layer

| | |
|---|---|
| Gas used: | CHF$_3$/Ar/O$_2$ = |
| | 20 sccm/200 sccm/20 sccm |
| RF power: | 1 kW |
| Pressure: | 6 Pa |
| Temperature: | 20° C. |

[Step 190]

Figure 8A:
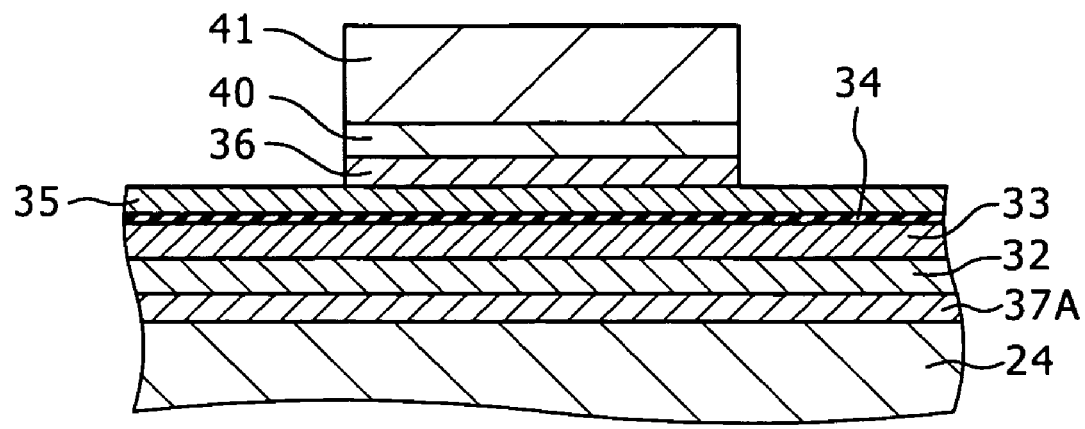
FIGS. 8A and 8B are schematic partly sectional views of the interlayer insulation layer and the like, for illustrating the method of manufacturing the nonvolatile magnetic memory device in Example 1, following FIG. 7C.
Figure 8B:
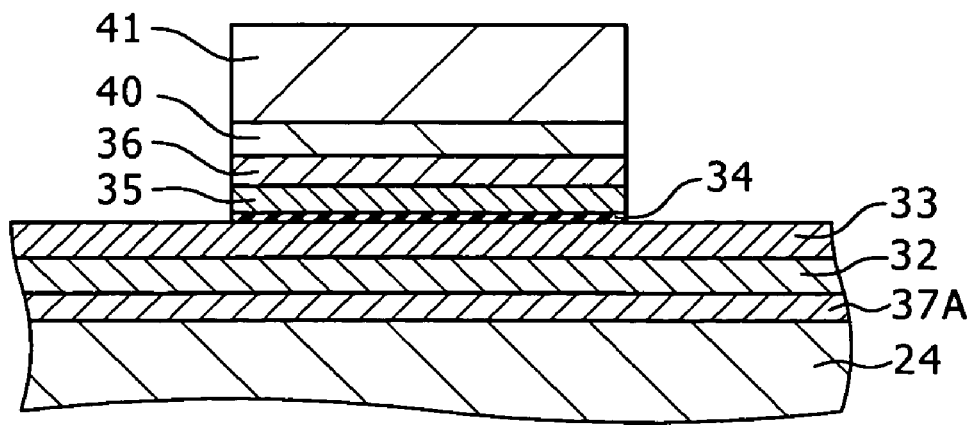

Next, using the hard mask layer 41, 40 as a mask, the top coat film 36 and the recording layer 35 are patterned by a reactive ion etching process (see FIGS. 8A and 8B). Exemplary etching conditions in this case are given in Tables 11 and 12 below.

TABLE 11

Etching Conditions for Top Coat Film 36

| | |
|---|---|
| Gas used: | Cl$_2$/BCl$_3$/N$_2$ = |
| | 60 sccm/80 sccm/10 sccm |
| Source power: | 1 kW |
| Bias power: | 150 W |
| Pressure: | 1 Pa |

TABLE 12

Etching Conditions for Recording Layer 35

| | |
|---|---|
| Gas used: | Cl$_2$/O$_2$/Ar = |
| | 50 sccm/20 sccm/20 sccm |
| Source power: | 1 kW |
| Bias power: | 150 W |
| Pressure: | 1 Pa |

Here, in the etching step for the recording layer 35, a time setting is made so that the etching is stopped during the etching of the tunnel insulation film 34. Incidentally, the etching conditions are so set as to obviate the problem that the etching products would deposit on the side walls of the recording layer 35 and the tunnel insulation film 34 with the result of an electrical shortcircuit between the recording layer 35 and the magnetization fixation layer 33, even in the case where the tunnel insulation film 34 is etched during the etching step for the recording layer 35 and, further, the etching proceeds to a part of the magnetization fixation layer 33. Thereafter, an ashing treatment and a water washing or organic washing treatment are carried out.

The top coat film 36 and the recording layer 35 may be patterned based on an ion milling process (ion beam etching process), instead of being patterned by the reactive ion etching process. Incidentally, after the etching, the deposits on the side walls, the etching gas residue, particles, etching residues and the like are removed by washing with water or an organic cleaning liquid, aerosol or the like Thereafter, the magnetization fixation layer 33 and the antiferromagnetic material layer 32 are patterned, and further the Ta layer 37A is patterned by a known method, whereby the extraction electrode 37 can be obtained. In this manner, it is possible to obtain a nonvolatile magnetic memory device including the tunnel magnetoresistance device TMJ having the recording layer 35 formed of a ferromagnetic material for storing information by use of variation in resistance depending on the magnetization inversion state thereof.

In the nonvolatile magnetic memory device including the tunnel magnetoresistance device using the TMR effect in Example 1, let the length of the longer axis LX of the pseudo-rhombic shape shown in FIG. 1 be 2L$_L$, and let the length of the shorter axis SX of the pseudo-rhombic shape be 2L$_S$, then the relationship 2L$_L$/2L$_S$=1190 nm/560 nm=2.13 was adopted, as shown in FIG. 3 or 4. In addition, let the radius of curvature of the plan-view shape of the recording layer 35 at the intersections BC and AD between the longer axis LX of the pseudo-rhombic shape and the plan-view shape of the recording layer 35 (or the radius of curvature of the plan-view shape of the recording layer 35 at the intersections BC and AD between the shorter axis SX of the pseudo-rhombic shape and the plan-view shape of the recording layer 35) be r$_L$, let the radius of curvature of the plan-view shape of the recording layer 35 at the intersections AB and CD between the shorter axis SX of the pseudo-rhombic shape and the plan-view shape of the recording layer 35 (or the radius of curvature of the plan-view shape of the recording layer 35 at the intersections AD and CD between the projected portion axis or the second shape axis and the plan-view shape of the recording layer 35) be r$_S$, then the relationships r$_L$/L$_S$=145 nm/280 nm=0.52 and r$_S$/L$_L$=480 nm/595 nm=0.81 were adopted. Or, as shown in FIG. 2, the relationship 2L$_{i-L}$/2L$_{i-S}$=1810 nm/640 nm=2.83 was adopted. In addition, let the radius of curvature of the plan-view shape of the recording layer 35 at the intersections BC$_5$ and AD$_5$ between the longer axis LX of the virtual rhombus and the plan-view shape of the recording layer 35 be r$_L$, and let the radius of curvature of the plan-view shape of the recording layer 35 at the intersections AB$_2$ and CD$_2$ between the shorter axis SX of the virtual rhombus and the plan-view shape of the recording layer 35 be r$_S$, then the relationships r$_L$/L$_{i-S}$=145 nm/320 nm=0.45 and r$_S$/L$_{i-L}$=480 nm/905 nm=0.53 were adopted. Furthermore, in the interval 0<X<X$_1$ in the side composed of a smooth curve, let the maximum distance between the side SR$_m$ composed of the smooth curve and the corresponding side TLm of the virtual rhombus be D$_{MAX}$, then the relationship D$_{MAX}$/X$_1$=18 nm/360 nm=1/20 was adopted. The above-mentioned values are collectively given in Table 13 below.

TABLE 13

| |
|---|
| L$_L$ = 595 nm |
| L$_S$ = 280 nm |
| L$_{i-L}$ = 905 nm |
| L$_{i-S}$ = 320 nm |
| r$_L$ = 145 nm |
| r$_S$ = 480 nm |
| D$_{MAX}$ = 18 nm |
| X$_1$ = 360 nm |

Figure 5:
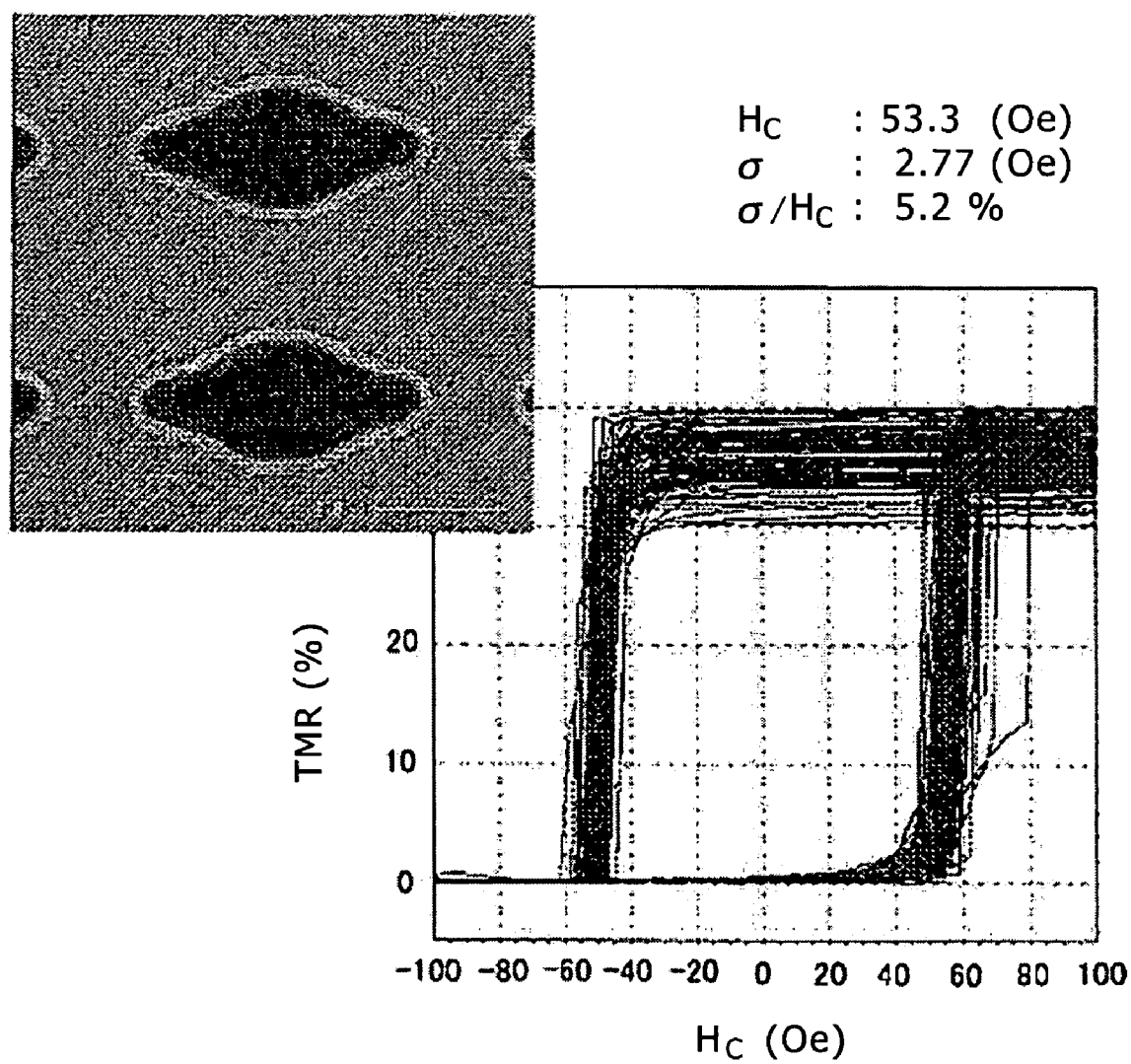
FIG. 5 shows an electron microphotograph of the plan-view of the recording layer provided in the nonvolatile magnetic memory device in Example 1, and an example of minor loop waveform.
Figure 7A:
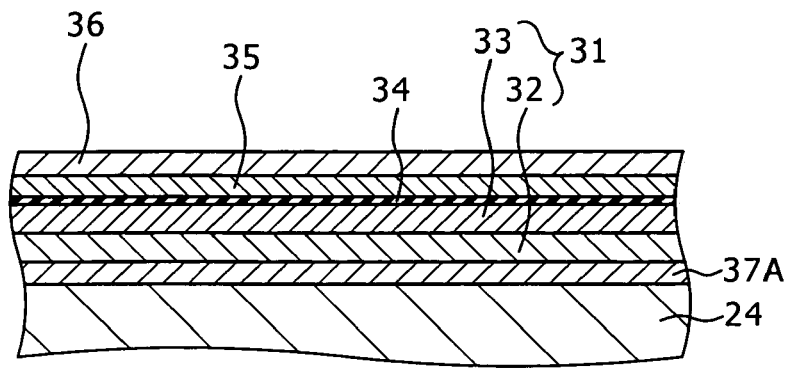
FIGS. 7A to 7C are schematic partly sectional views of an interlayer insulation layer and the like, for illustrating a method of manufacturing the nonvolatile magnetic memory device in Example 1.
Figure 7B:
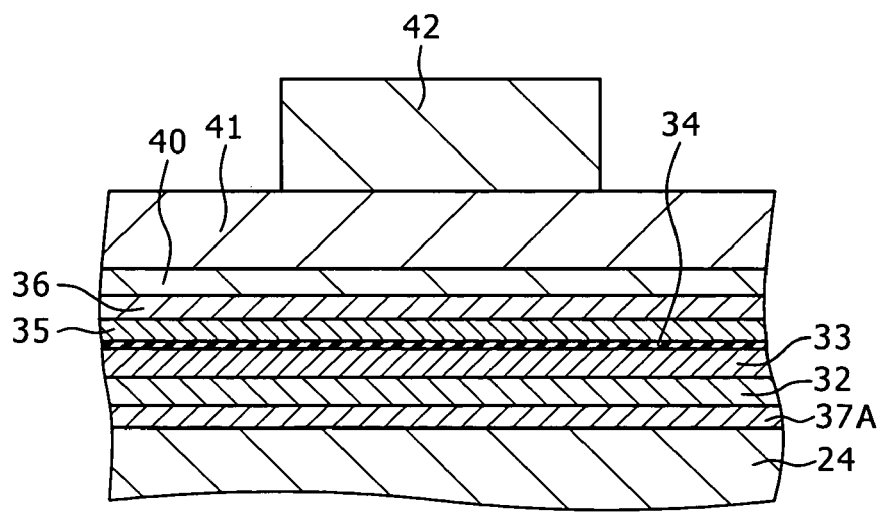
Figure 7C:
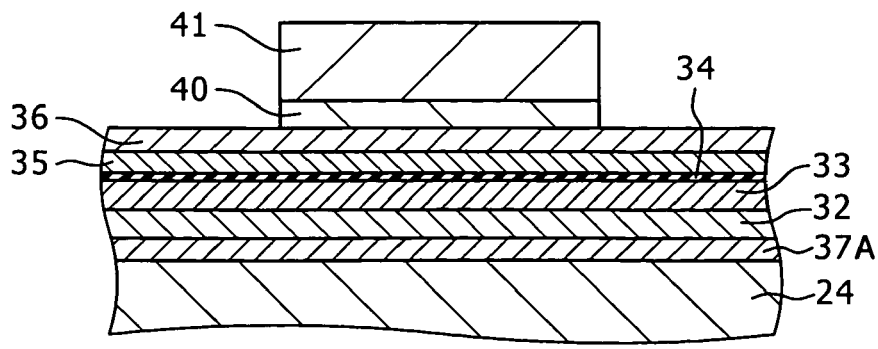

In the nonvolatile magnetic memory device including the tunnel magnetoresistance device having the above-mentioned data, a test of once measuring the magnetic field H$_C$ at the time of inversion of the magnetization direction of the recording layer 35 as a minor loop waveform, determining the average $H_{AVE}$ and the standard deviation σ of the magnetic field $H_C$, and further determining $σ/H_{AVE}$ (SOA), was performed for 50 to 100 specimens. Examples of the minor loop waveform and an electron microphotograph of the plan-view shape of the recording layer 35 are shown in FIG. 5.

On the other hand, for comparison, a nonvolatile magnetic memory device including a tunnel magnetoresistance device in which the plan-view shape of the recording layer 35 has a rectangle with the length in the easy axis direction of 1160 nm and with the length in the hard axis direction of 540 nm was manufactured in the same semiconductor substrate (in the same wafer) as that for the nonvolatile magnetic memory device of Example 1, then the average $H_{AVE}$ and the standard deviation σ of the magnetic field $H_C$ were determined similarly to the above, and further $σ/H_{AVE}$ (SOA) was determined. Incidentally, this test will be referred to as Comparative Example 1.

Furthermore, for comparison, a nonvolatile magnetic memory device including a tunnel magnetoresistance device in which the plan-view shape of the recording layer 35 has an ellipse with the length of the longer axis in the easy axis direction of 1160 nm and with the length of the shorter axis in the hard axis direction of 540 nm was manufactured in the same semiconductor substrate (in the same wafer) as that for the nonvolatile magnetic memory devices of Example 1 and Comparative Example 1, then the average $H_{AVE}$ and the standard deviation σ of the magnetic field $H_C$ were determined similarly to the above, and further $σ/H_{AVE}$ (SOA) was determined. Incidentally, this test will be referred to as Comparative Example 2.

The results of Example 1, Comparative Example 1, and Comparative Example 2 are shown in Table 15.

EXAMPLE 2

Example 2 pertains to the nonvolatile magnetic memory devices according to the fifth to eighth embodiments of the present invention. The nonvolatile magnetic memory deice of Example 2 including a magnetoresistance device having a recording layer formed of a ferromagnetic material for storing information by variation in resistance depending on the magnetization inversion state thereof is also a nonvolatile magnetic memory device including a tunnel magnetoresistance device using the TMR effect, in the same manner as in Example 1. Incidentally, the tunnel magnetoresistance device TMJ and the nonvolatile magnetic memory device in Example 2 also have the same configurations and structures as those of the tunnel magnetoresistance device TMJ and the nonvolatile magnetic memory device in Example 1, except for the difference in the plan-view shape of the recording layer; therefore, the following description will be made only of the plan-view shape of the recording layer.

Figure 9:
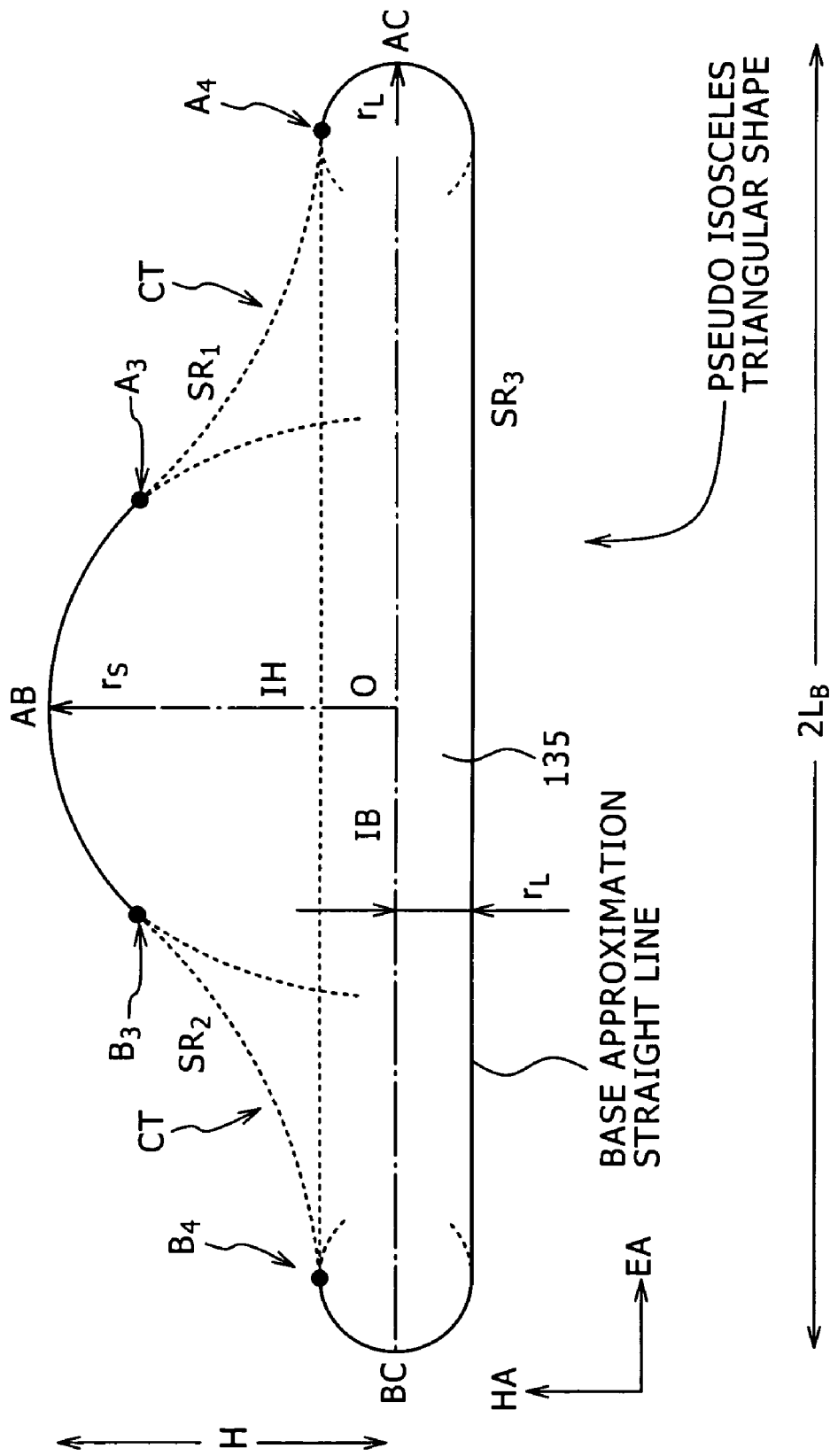
FIG. 9 is a schematic plan view of the recording layer in the nonvolatile magnetic memory device in Example 2 as the nonvolatile magnetic memory device according to the fifth embodiment of the present invention.

Here, in the nonvolatile magnetic memory device of Example 2 as the nonvolatile magnetic memory device according to the fifth embodiment of the present invention, as a schematic plan view of a recording layer 135 is shown in FIG. 9, the plan-view shape (indicated by solid line) of the recording layer 135 has a pseudo isosceles triangular shape having three sides $SR_n$ (where "n" is any of 1, 2, and 3). The oblique lines $SR_1$ and $SR_2$ of the pseudo isosceles triangular shape are each composed of a smooth curve having a central portion CT thereof curved toward the center of the pseudo isosceles triangular shape. The easy axis (EA) of the recording layer 135 is substantially parallel to the base $SR_3$ of the pseudo isosceles triangular shape, and the hard axis (HA) of the recording layer 135 is substantially orthogonal to the base $SR_3$ of the pseudo isosceles triangular shape. Further, the sides $SR_n$ constituting the plan-view shape of the recording layer 135 are smoothly connected to each other.

At least two points of inflection are present in each of the oblique lines of the pseudo isosceles triangular shape. Specifically, two inflection points ($A_3$, $A_4$) are present in the oblique line $SR_1$, and two inflection points ($B_3$, $B_4$) are present in the oblique line $SR_2$.

Here, as shown in FIG. 9, the plan-view shape of the recording layer 135 is substantially line symmetric with respect to the perpendicular bisector of the base of the pseudo isosceles triangular shape.

The length of the imaginary base IB of the pseudo isosceles triangular shape shown in FIG. 9 is $2L_B$, the virtual height is H, the average radius of curvature of the plan-view shape of the recording layer 135 at the portions where the oblique lines $SR_1$ and $SR_2$ of the pseudo isosceles triangular shape are smoothly connected to the base $SR_3$ is $r_L$, and the radius of curvature of the plan-view shape of the recording layer 135 at the intersection AB of the two oblique lines $SR_1$ and $SR_2$ of the pseudo isosceles triangular shape is $r_S$. Here, the intersection of the two oblique lines $SR_1$ and $SR_2$ of the pseudo isosceles triangular shape means the intersection AB at which the perpendicular bisector IH of the imaginary base IB intersects a curve obtained by connecting the two oblique lines $SR_1$ and $SR_2$ of the pseudo isosceles triangular shape into one line. In addition, the imaginary base IB of the pseudo isosceles triangular shape means an imaginary line which, when the base $SR_3$ of the pseudo isosceles triangular shape is approximated by a straight line (base approximation straight line), is parallel to the base approximation straight line and passes through a point located on the side of the intersection of the two oblique lines $SR_1$ and $SR_2$ of the pseudo isosceles triangular shape and spaced from the base approximation straight line by a distance $r_L$. Further, the length $2L_B$ of the imaginary base is defined as the distance between the intersections between the plan-view shape of the recording layer 135 and the imaginary base IB at the portions where the oblique lines $SR_1$ and $SR_2$ of the pseudo isosceles triangular shape are smoothly connected to the base $SR_3$ (the distance between point BC and point AC). In addition, the virtual height H is defined as the distance from the intersection AB of the two oblique lines $SR_1$ and $SR_2$ of the pseudo isosceles triangular shape to the imaginary base IB. The length $2L_B$ of the imaginary base IB and the virtual height H satisfy the relationship of $H<L_B$.

Figure 10:
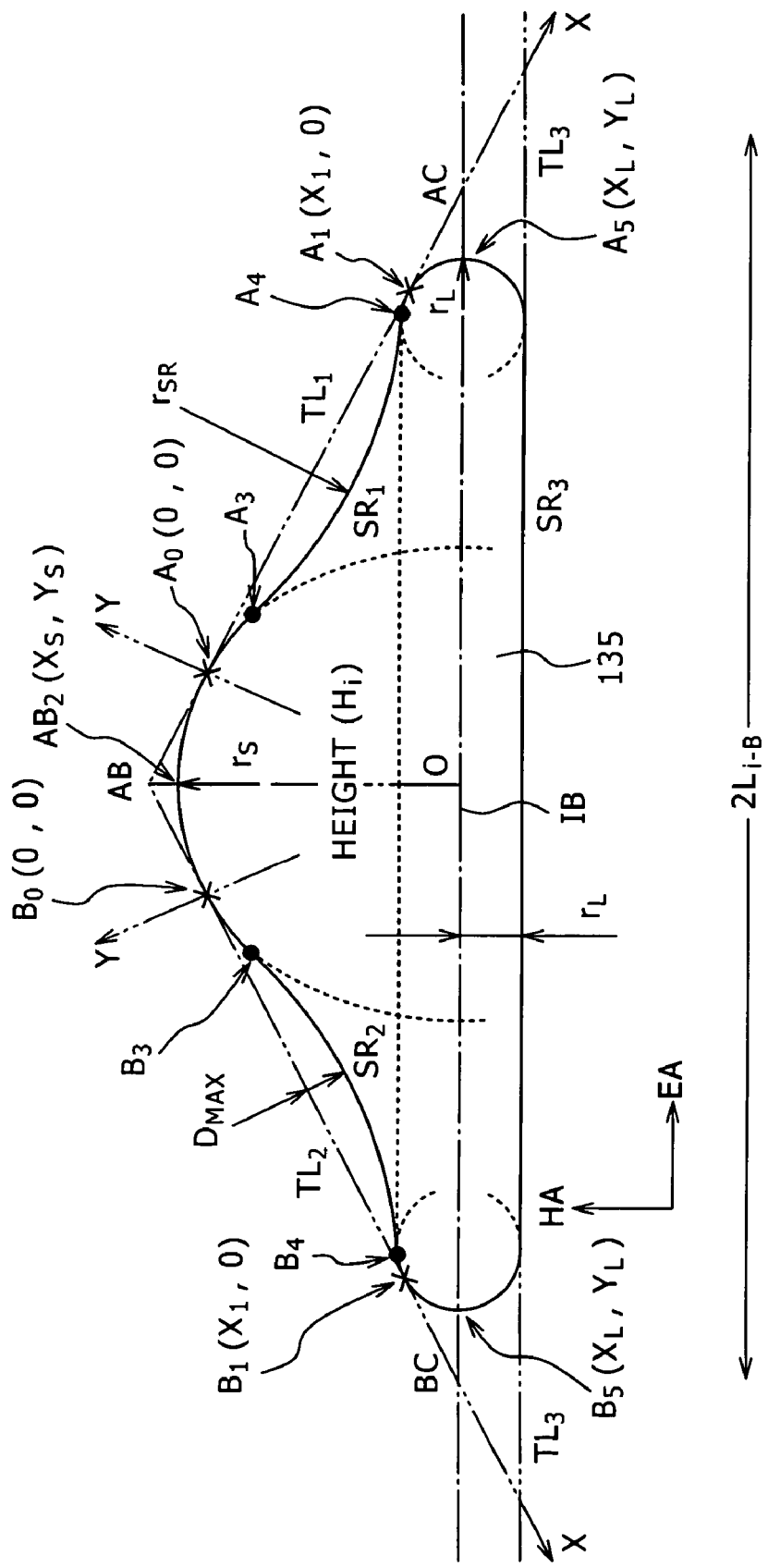
FIG. 10 is a schematic plan view of the recording layer in the nonvolatile magnetic memory device in Example 2 as the nonvolatile magnetic memory device according to the sixth embodiment of the present invention.

Alternatively, in the nonvolatile magnetic memory device of Example 2 as the nonvolatile magnetic memory device according to the sixth embodiment of the present invention, as a schematic plan view of a recording layer 135 is shown in FIG. 10, the plan-view shape (indicated by solid line) of the recording layer 135 has three sides $SR_n$, and at least two of the three sides (in Example 2, the sides $SR_1$ and $SR_2$) are each composed of a smooth curve. Besides, the plan-view shape of the recording layer 135 is inscribed in a virtual isosceles triangle (indicated by two-dotted chain line). Incidentally, in FIG. 10, the inscribing points are indicated by mark "x". Here, the virtual isosceles triangle has an imaginary base IB (indicated by dot-dash line) having a length $2L_{i-B}$, and the imaginary height (the distance from point O to point AB) is $H_i$ [where $H_i<L_{i-B}$]. Incidentally, the imaginary base IB of the virtual isosceles triangle means an imaginary line which is parallel to the base $TL_3$ of the virtual isosceles triangle and passes through a point located on the side of the intersection of the two oblique lines $TL_1$ and $TL_2$ of the virtual isosceles triangle and spaced from the base $TL_3$ of the virtual isosceles triangle by a distance $r_L$, where $r_L$ is the average radius of curvature of the plan-view shape of the recording layer 135 at the portions where the side $SR_3$ constituting the plan-view shape 135 and corresponding to the base $TL_3$ of the virtual isosceles triangle is smoothly connected to the sides $SR_1$ and $SR_2$ constituting the plan-view shape of the recording layer 135 and corresponding to the oblique lines $TL_1$ and $TL_2$ of the virtual isosceles triangle. In addition, the length $2L_{i-B}$ of the imaginary base IB is the distance between the intersections BC and AC at which the imaginary base IB intersects the two oblique lines $TL_1$ and $TL_2$ of the virtual isosceles triangle. Further, the imaginary height $H_i$ is the distance from the intersection AB of the two oblique lines $TL_1$ and $TL_2$ of the virtual isosceles triangle to the imaginary base IB. Besides, the base $SR_3$ is substantially parallel to the easy axis (EA) of the recording layer 135, and the perpendicular to the base $SR_3$ is substantially parallel to the hard axis (HA) of the recording layer 135. Furthermore, each of the sides $SR_1$ and $SR_2$ composed of smooth curves contacts the corresponding side $TL_1$ or $TL_2$ at at least two points (in Example 2, two points). Incidentally, in FIG. 10, the point of contact is indicated by mark "x". Moreover, the sides $SR_n$ constituting the plan-view shape of the recording layer 135 are smoothly connected to each other.

In the oblique line $SR_1$ including a smooth curve and constituting the plan-view shape of the recording layer 135, (a) the point closest to the intersection AB between the two oblique lines $TL_1$ and $TL_2$ of the virtual isosceles triangle, of at least two points of contact with the oblique line $TL_1$, is made to be the origin $A_0$ (0, 0) of a Gaussian coordinate system, (b) the point closest to the intersection AC between the oblique line $TL_1$ and the base $TL_3$ of the virtual isosceles triangle, of at least two points of contact with the oblique line $TL_1$, is made to be $A_1$ ($X_1$, 0) [where $X_1 > 0$], (c) the intersection with the perpendicular bisector of the base $TL_3$ of the virtual isosceles triangle is made to be $AB_2$ ($X_S$, $Y_S$) [where $X_S < 0$, $Y_S < 0$], and (d) the intersection with the imaginary base IB of the virtual isosceles triangle is made to be $A_5$ ($X_L$, $Y_L$) [where $X_L > 0$, $Y_L < 0$].

Further, the oblique line $SR_1$ is represented by a real variable function F(X), and it is assumed that the intersection between the perpendicular bisector of the base of the virtual isosceles triangle and the base is located in the third quadrant or the fourth quadrant (in the example shown, the fourth quadrant).

In this case, the real variable function F(X) has a continuous differential coefficient at each point in the interval $X_S < X < X_L$, and has two points of inflection ($A_3$, $A_4$) in the interval $0 < X < X_1$.

More specifically, in the interval $X_S < X \leq X_{A3}$ ($X_{A3}$ is the X-coordinate of the inflection point $A_3$), the real variable function F(X) is represented by a circle with a radius $r_S$. Besides, in the interval $X_{A3} \leq X \leq X_{A4}$ ($X_{A4}$ is the X-coordinate of the inflection point $A_4$), the real variable function F(X) is represented by a circle with a radius $r_{SR}$. Further, in the interval $X_{A4} < X \leq X_L$, the real variable function F(X) is represented by a circle with a radius $r_L$.

In addition, in the oblique line $SR_2$ including a smooth curve and constituting the plan-view shape of the recording layer 135, (a) the point closest to the intersection AB between the two oblique lines $TL_1$ and $TL_2$ of the virtual isosceles triangle, of at least two points of contact with the oblique line $TL_2$, is made to be the origin $B_0$ (0, 0) of a Gaussian coordinate system, (b) the point closest to the intersection BC between the oblique line $TL_2$ and the base $TL_3$ of the virtual isosceles triangle, of at least two points of contact with the oblique line $TL_2$, is made to be $B_1$ ($X_1$, 0) [where $X_1 > 0$], (c) the intersection with the perpendicular bisector of the base $TL_3$ of the virtual isosceles triangle is made to be $AB_2$ ($X_S$, $Y_S$) [where $X_S < 0$, $Y_S < 0$], and (d) the intersection with the imaginary base IB of the virtual isosceles triangle is made to be $B_5$ ($X_L$, $Y_L$) [where $X_L > 0$, $Y_L < 0$].

Further, the oblique line $SR_2$ is represented by a real variable function F(X), and it is assumed that the intersection between the perpendicular bisector of the base of the virtual isosceles triangle and the base is located in the third quadrant or the fourth quadrant (in the example shown, the fourth quadrant).

In this case, the real variable function F(X) has a continuous differential coefficient at each point in the interval $X_S < X < X_L$, and has two points of inflection ($B_3$, $B_4$) in the interval $0 < X < X_1$.

More specifically, in the interval $X_S < X \leq X_{B3}$ ($X_{B3}$ is the X-coordinate of the inflection point $B_3$), the real variable function F(X) is represented by a circle with a radius $r_S$. Besides, in the interval $X_{B3} \leq X \leq X_{B4}$ ($X_{B4}$ is the X-coordinate of the inflection point $B_4$), the real variable function F(X) is represented by a circle with a radius $r_{SR}$. Further, in the interval $X_{B4} < X \leq X_L$, the real variable function F(X) is represented by a circle with a radius $r_L$.

Incidentally, in the interval $X_S < X < 0$, the first-order differential coefficient of the real variable function F(X) is a positive value; at X=0, the first-order differential coefficient of the real variable function F(X) is 0; and in the interval $0 < X < X_1$, the first-order differential coefficient of the real variable function F(X) varies from a negative value to 0 and, further, to a positive value. In addition, at X=$X_1$, the first-order differential coefficient of the real variable function F(X) is 0, and, when X exceeds $X_1$, the first-order differential coefficient of the real variable function F(X) takes a negative value.

Further, in the interval $X_S < X < X_{A3}$ (or $X_{B3}$), the second-order differential coefficient of the real variable function F(X) is a negative value; at X=$X_{A3}$ (or $X_{B3}$), the second-order differential coefficient of the real variable function F(X) is 0; in the interval $X_{A3}$ (or $X_{B3}$) $< X < X_{A4}$ (or $X_{B4}$), the second-order differential coefficient of the real variable function F(X) is positive; at X=$X_{A4}$ (or $X_{B4}$), the second-order differential coefficient of the real variable function F(X) is 0; and, in the interval $X < X_{A4}$ (or $X_{B4}$), the second-order differential coefficient of the real variable function F(X) is a negative value.

Besides, when a Gaussian coordinate system is assumed with the imaginary base IB of the virtual isosceles triangle as the x-axis and with the perpendicular bisector of the imaginary base IB as the y-axis and when the oblique line $SR_1$ and the oblique line $SR_2$ are collectively represented by a real variable function F(x), then the real variable function F(x) has a continuous differential coefficient at each point in the interval $a < x < b$ (where a is the minimum allowable value of x in the real variable function F(x), and b is the maximum allowable value of x in the real variable function F(x)). In addition, the first-order differential coefficient of the real variable function F(x) at x=0 is 0, and the first-order differential coefficient of the real variable function F(x) at y=0 is $\infty$.

Also in the recording layer 135 shown in FIG. 10, the plan-view shape is substantially line symmetric with respect to the perpendicular bisector of the base of the virtual isosceles triangle.

Figure 11:
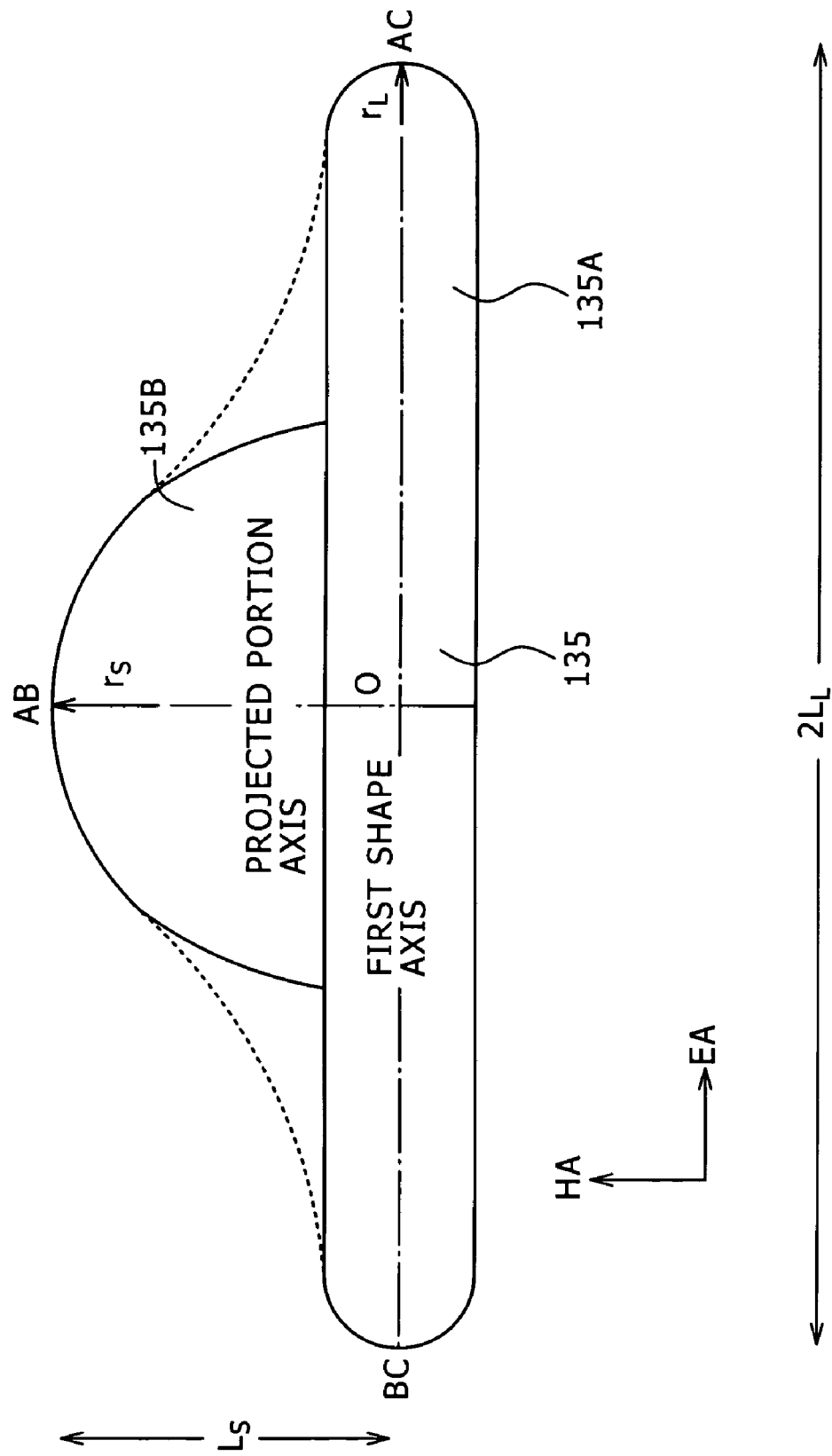
FIG. 11 is a schematic plan view of the recording layer in the nonvolatile magnetic memory device in Example 2 as the nonvolatile magnetic memory device according to the seventh embodiment of the present invention.

Or, alternatively, in the nonvolatile magnetic memory device in Example 2 as the nonvolatile magnetic memory device according to the seventh embodiment of the present invention, as a schematic plan view of a recording layer 135 is shown in FIG. 11, the plan-view shape of the recording layer 135 includes a first shape 135A (indicated by solid line in FIG. 11), and one projected portion 135B (indicated by solid line in FIG. 11) projected from the first shape 135A. The projected portion 135B is located on the projected portion axis (indicated by dot-dash line in FIG. 11). Here, the projected portion axis passes through the center O of the first shape 135A, and the projected portion axis orthogonally intersects the first shape axis (indicated by dot-dash line in FIG. 11) passing through the center O of the first shape 135A. In addition, the easy axis (EA) of the recording layer 135 is substantially parallel to the first shape axis, and the hard axis (HA) of the recording layer 135 is substantially parallel to the projected portion axis. Further, let the length of the first shape 135A along the first shape axis be $2L_L$, and let the distance from a tip end portion of the projected portion 135B to the center O of the first shape 135A along the projected portion axis be $L_S$, then the relationship $L_L > L_S$ is satisfied. Besides, the portions where the visible outline of the first shape 135A and the visible outline of the projected portion 135B intersect each other each include a smooth curve (indicated by broken line in FIG. 11) curved toward the center O of the first shape 135A.

The first shape 135A is a flat oval, i.e., a figure composed of a combination of two semi-circles (radius: $r_L$) with two line segments. In addition, the projected portions 135B each have a figure composed of a part of a circle (radius: $r_S$).

Incidentally, the plan-view shape of the recording layer 135 is substantially line symmetric with respect to the projected portion axis.

Figure 12:
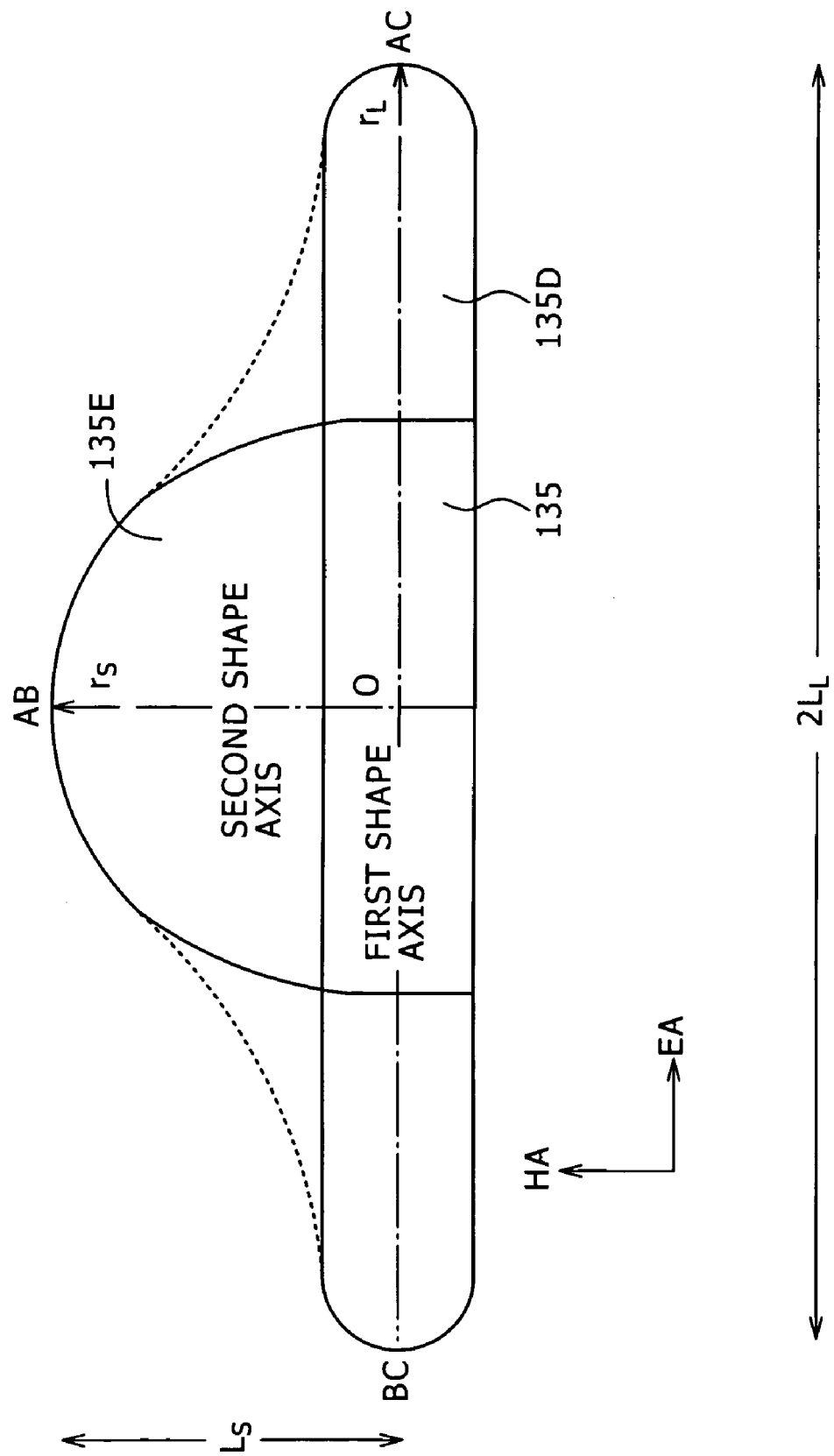
FIG. 12 is a schematic plan view of the recording layer in the nonvolatile magnetic memory device in Example 2 as the nonvolatile magnetic memory device according to the eight embodiment of the present invention.

Or, alternatively, in the nonvolatile magnetic memory device in Example 2 as the nonvolatile magnetic memory device according to the eighth embodiment of the present invention, as a schematic plan view of a recording layer 135 is shown in FIG. 12, the plan-view shape of the recording layer 135 has a superposed shape in which a first shape 135D and a second shape 135E are superposed on each other so that the second shape 135E is projected from the first shape 135D at one position. The second shape 135E is located on the second shape axis, which passes through the center O of the first shape 135D and orthogonally intersects the first shape axis passing through the center O of the first shape 135D. Further, the easy axis (EA) of the recording layer 135 is substantially parallel to the first shape axis, and the hard axis (HA) of the recording layer 135 is substantially parallel to the second shape axis. Let the length of the first shape 135D along the first shape axis be $2L_L$, and let the distance from a tip end portion of the second shape 135E to the center O of the first shape 135D along the second shape axis be $L_S$, then the relationship $L_L > L_S$ is satisfied. Further, the portions where the visible outline of the first shape 135D and the visible outline of the second shape 135E intersect each other each have a smooth curve (indicated by broken line in FIG. 12) curved toward the center O of the first shape 135D.

The first shape 135D is a flat oval, i.e., a figure composed of a combination of two semi-circles (radius: $r_L$) with two line segments. The second shape 135E is a figure composed of a combination of a semi-circle (radius: $r_S$) with two line segments.

Incidentally, the plan-view shape of the recording layer 135 is substantially line symmetric with respect to the second shape axis.

In the nonvolatile magnetic memory device including the tunnel magnetoresistance device using the TMR effect in Example 2, let the length of the imaginary base of the pseudo isosceles triangular shape be $2L_B$, and let the virtual height be H, then a setting of $L_B/H = L_L/L_S = 625$ nm/415 nm=1.51 was adopted, as shown in FIG. 11 or 12. In addition, let the average radius of curvature of the plan-view shape of the recording layer 135 at the portions where the oblique lines $SR_1$ and $SR_2$ of the pseudo isosceles triangular shape are smoothly connected to the base $SR_3$ (or the radius of curvature of the plan-view shape of the recording layer 135 at the intersections BC and AC between the first shape axis and the plan-view shape of the recording layer 135) be $r_L$, and let the radius of curvature of the plan-view shape of the recording layer 135 at the intersection AB of the two oblique lines $SR_1$ and $SR_2$ of the pseudo isosceles triangular shape (or the radius of curvature of the plan-view shape of the recording layer 135 at the intersection AB between the projected portion axis or the second shape axis and the plan-view shape of the recording layer 135) be $r_S$, then a setting of $r_L/L_S = 175$ nm/415 nm=0.42 and a setting of $r_S/L_L = 380$ nm/625 nm=0.61 were adopted. Or, alternatively, as shown in FIG. 10, a setting of $L_{i-L}/H_i = 840$ nm/420 nm=2.0 was adopted. In addition, let the average radius of curvature of the plan-view shape of the recording layer 135 at the portions where the side $SR_3$ constituting the plan-view shape of the recording layer 135 corresponding to the base $TL_3$ of the virtual isosceles triangle is smoothly connected to the sides $SR_1$ and $SR_2$ constituting the plan-view shape of the recording layer 135 corresponding to the oblique lines $TL_1$ and $TL_2$ of the virtual isosceles triangle be $r_L$, and let the radius of curvature of the plan-view shape of the recording layer 135 at the intersection $AB_2$ between the angular bisector at the intersection AB of the two oblique lines $TL_1$ and $TL_2$ of the virtual isosceles triangle and the plan-view shape of the recording layer 135 be $r_S$, then a setting of $r_L/H_i = 175$ nm/420 nm=0.42 and a setting of $r_S/L_{i-B} = 380$ nm/840 nm=0.45 were adopted. Further, in the interval $0 < X < X_1$ of the oblique lines $SR_1$ and $SR_2$ composed of smooth lines, let the maximum distance between the side $SR_1$, $SR_2$ and the corresponding oblique line $TL_1$, $TL_2$ of the virtual isosceles triangle be $D_{MAX}$, then a setting of $D_{MAX}/X_1 = 23$ nm/390 nm=0.059 was adopted. The above-mentioned values are collectively given in Table 14 below.

TABLE 14

$L_B = L_L = 625$ nm
$H = L_S = 415$ nm
$L_{i-B} = 840$ nm
$H_i = 420$ nm
$r_L = 175$ nm
$r_S = 380$ nm
$D_{MAX} = 23$ nm
$X_1 = 390$ nm

In the nonvolatile magnetic memory device including the tunnel magnetoresistance device having the above data, the average $H_{AVE}$ and the standard deviation σ of the magnetic field $H_C$ at the time of inversion of the magnetization direction of the recording layer 135 were determined, in the same manner as in Example 1, and σ/$H_{AVE}$ (SOA) was further determined.

The results of Example 2 are shown in Table 15 below. In Example 1 and Example 2, the values of σ/$H_{AVE}$ (SOA) are remarkably low. In other words, it is possible to largely reduce the dispersion of the switching magnetic field.

TABLE 15

|  | $H_{AVE}$ (Oe) | σ (Oe) | σ/$H_{AVE}$ |
|---|---|---|---|
| Example 1 | 52.5 | 2.4 | 4.6% |
| Example 2 | 49.8 | 3.8 | 7.6% |

TABLE 15-continued

|  | $H_{AVE}$ (Oe) | σ (Oe) | σ/$H_{AVE}$ |
|---|---|---|---|
| Comparative Example 1 | 30.3 | 3.5 | 11.6% |
| Comparative Example 2 | 37.6 | 4.8 | 12.8% |

EXAMPLE 3

Example 3 pertains to a photomask according to the one embodiment of the present invention. The photomask in Example 3 is a photomask for use in a lithography step for forming the recording layer 35 described in Example 1 above. Specifically, the recording layer 35 is a recording layer constituting the magnetoresistance device in the nonvolatile magnetic memory device, the recording layer including:

(A) a ferromagnetic material for storing information by use of variation in resistance depending on the magnetization inversion state thereof, (B) the plan-view shape of the recording layer being a pseudo-rhombic shape, (C) the four sides $SR_m$ constituting the pseudo-rhombic shape each including a smooth curve having a central portion thereof curved toward the center of the pseudo-rhombic shape, (D) the easy axis (EA) of the recording layer being substantially parallel to the longer axis LX of the pseudo-rhombic shape, (E) the hard axis (HA) of the recording layer being substantially parallel to the shorter axis SX of the pseudo-rhombic shape, and (F) the sides $SR_m$ being smoothly connected to each other.

Figure 13A:
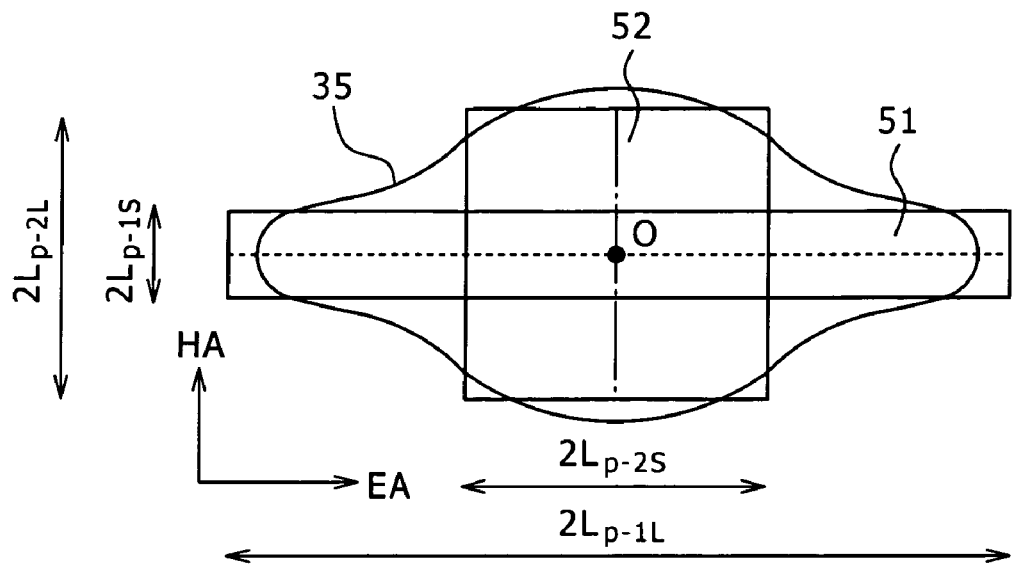
FIGS. 13A and 13B show a pattern provided in a photomask in Example 3, and the plan-view shape of the recording layer obtained based on the pattern.

As shown in FIG. 13A, a pattern provided in the photomask for obtaining the recording layer 35 includes a first shape 51 and a second shape 52, and has a superposed shape in which the first shape 51 and the second shape 52 having a center O coinciding with the center of the first shape 51 are superposed on each other so that the second shape 52 is projected from the first shape 51 at two positions. In addition, the first shape axis (indicated by broken line) passing through the center O of the first shape 51 and the second shape axis (indicated by two-dotted chain line) passing through the center O of the second shape 52 orthogonally intersect each other.

In Example 3, the first shape 51 assumes a polygon (more specifically, a rectangle) of which the length along the first shape axis substantially parallel to the easy axis (EA) is $2L_{p-1L}$ and the length along the direction perpendicular to the first shape axis is $2L_{p-1S}$ [where $L_{p-1S}<L_{p-1L}$]. On the other hand, the second shape 52 assumes a regular polygon (more specifically, a square) of which the length along the second shape axis substantially parallel to the hard axis (HA) is $2L_{p-2L}$ [where $L_{p-1S}<L_{p-2L}<L_{p-1L}$] and the length along the direction passing through the center O of the second shape 52 and being perpendicular to the second shape axis is $2L_{p-2S}$ [where $L_{p-2S}<L_{p-1L}$].

Here, the values of $2L_{p-1L}$, $2L_{p-1S}$, $2L_{p-2L}$, and $2L_{p-2S}$ are as given in Table 16 below. By using such a pattern as this, it is possible to obtain a recording layer 35 having a pseudo-rhombic shape as shown in FIG. 13A. Incidentally, the size data of the recording layer 35 are approximate to the values shown in Table 13.

TABLE 16

| $2L_{p-1L}$ = 1200 nm |
| $2L_{p-1S}$ = 250 nm |
| $2L_{p-2L}$ = 460 nm |
| $2L_{p-2S}$ = 460 nm |

Figure 13B:
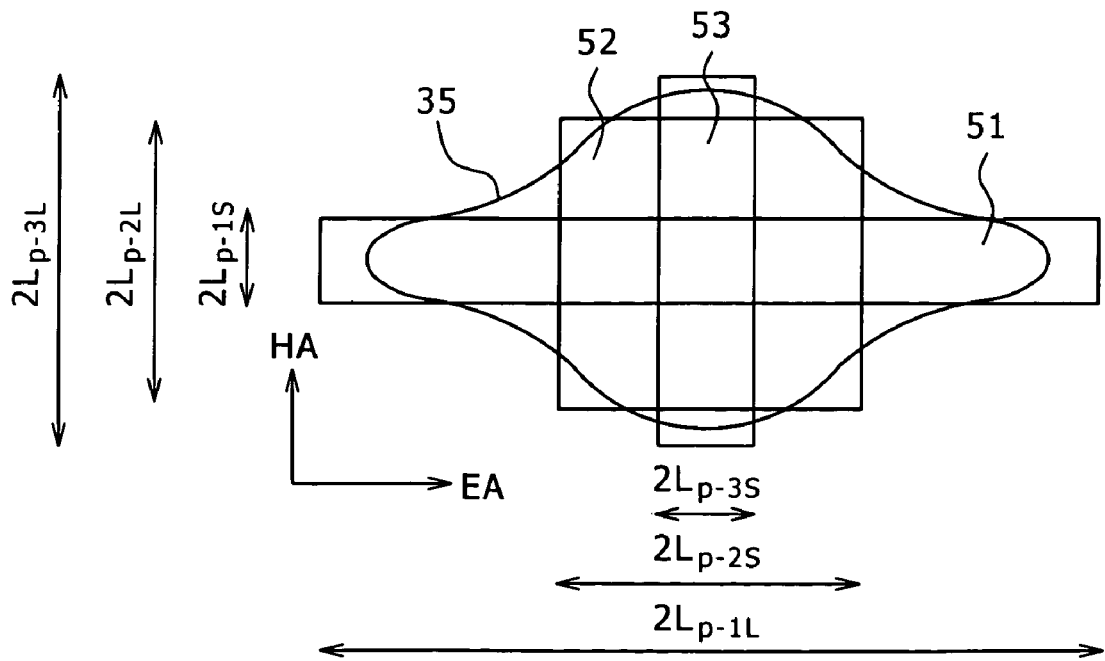

Incidentally, the number of the second shape(s) is not limited to one. FIG. 13B shows an example in which the number of the second shape(s) is two.

In this example, the second shape 52 assumes a regular polygon (more specifically, a square) of which the length along the second shape axis substantially parallel to the hard axis (HA) is $2L_{p-2L}$ [where $L_{p-1S}<L_{p-2L}<L_{p-1L}$] and the length along the direction passing through the center of the second shape 52 and being perpendicular to the second shape axis is $2L_{p-2S}$ [where $L_{p-2S}<L_{p-1L}$]. In addition, another second shape 53 assumes a polygon (more specifically, a rectangle) of which the length along the second shape axis substantially parallel to the hard axis (HA) is $2L_{p-3L}$ [where $L_{p-2L}<L_{p-3L}<L_{p-1L}$] and the length along the direction passing through the center of the other second shape 53 and being perpendicular to the second shape axis is $2L_{p-3S}$ [where $L_{p-3S}<L_{p-2S}$].

Here, the values of $2L_{p-1L}$, $2L_{p-1S}$, $2L_{p-2L}$, $2L_{p-2S}$, $2L_{p-3L}$, and $2L_{p-3S}$ are as given in Table 17 below. By using such a pattern as this, it is possible to obtain a recording layer 35 having a pseudo-rhombic shape as shown in FIG. 13B. Incidentally, the size data of the recording layer 35 are approximate to the values shown in Table 13.

TABLE 17

| $2L_{p-1L}$ = 1200 nm |
| $2L_{p-1S}$ = 250 nm |
| $2L_{p-2L}$ = 460 nm |
| $2L_{p-2S}$ = 460 nm |
| $2L_{p-3L}$ = 600 nm |
| $2L_{p-3S}$ = 200 nm |

EXAMPLE 4

Example 4 pertains to a photomask according to the another embodiment of the present invention. The photomask in Example 4 is a photomask for use in a lithography step for forming the recording layer 135 described in Example 2. Specifically, the recording layer 135 is a recording layer constituting the magnetoresistance device in the nonvolatile magnetic memory device, the recording layer including:

(A) a ferromagnetic material for storing information by use of variation in resistance depending on the magnetization inversion state thereof, (B) the plan-view shape being a pseudo isosceles triangular shape, (C) the oblique lines $SR_1$ and $SR_2$ of the pseudo isosceles triangular shape each including a smooth curve having a central portion thereof curved toward the center of the pseudo isosceles triangular shape, (D) the easy axis (EA) being substantially parallel to the base $SR_3$ of the pseudo isosceles triangular shape, (E) the hard axis (HA) being substantially orthogonal to the base $SR_3$ of the pseudo isosceles triangular shape, and (F) the sides $SR_n$ being smoothly connected to each other.

Figure 14A:
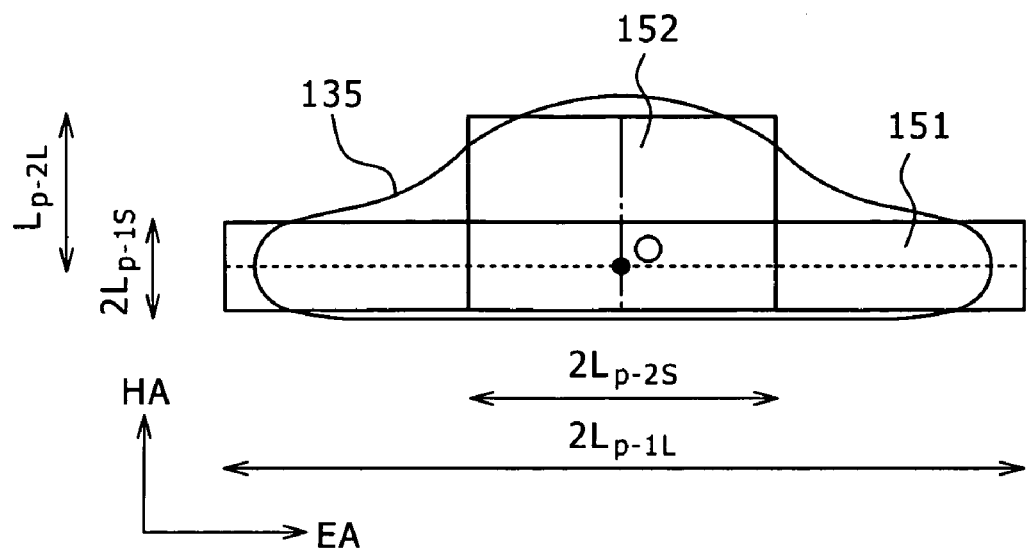
FIGS. 14A and 14B show a pattern provided in a photomask in Example 4, and the plan-view shape of the recording layer obtained based on the pattern.

As shown in FIG. 14A, a pattern provided in the photomask for obtaining the recording layer 135 includes a first shape 151 and a second shape 152, and has a superposed shape in which the first shape 151 and the second shape 152 are superposed on each other so that the second shape 152 is projected from the first shape 151 at one position. In addition, the second shape 152 is located on the second shape axis (indicated by two-dotted chain line). Further, the second shape axis passes through the center O of the first shape 151, and orthogonally intersects the first shape axis (indicated by broken line) passing through the center O of the first shape 151.

In Example 4, the first shape 151 assumes a polygon (more specifically, a rectangle) of which the length along the first shape axis substantially parallel to the easy axis (EA) is $2L_{p-1L}$, the length along the direction passing through the center O of the first shape 151 and being perpendicular to the first shape axis is $2L_{p-1S}$ [where $L_{p-1S}<L_{p-1L}$]. On the other hand, the second shape 152 assumes a polygon (more specifically, a rectangle) of which the distance from a tip end portion of the second shape 152 to the center O of the first shape 151 along the second shape axis substantially parallel to the hard axis (HA) is $L_{p-2L}$ [where $L_{p-1S}<L_{p-2L}<L_{p-1L}$] and the length along the direction passing through the center O of the first shape 151 and being perpendicular to the second shape axis is $2L_{p-2S}$ [where $L_{p-2S}<L_{p-1L}$].

Here, the values of $2L_{p-1L}$, $2L_{p-1S}$, $L_{p-2L}$, and $2L_{p-2S}$ are as given in Table 18 below. By using such a pattern as this, it is possible to obtain a recording layer 135 having the pseudo-rhombic shape as shown in FIG. 14A. Incidentally, the size data of the recording layer 135 are approximate to the values shown in Table 14.

TABLE 18

| |
|---|
| $2L_{p-1L}$ = 1200 nm |
| $2L_{p-1S}$ = 300 nm |
| $L_{p-2L}$ = 310 nm |
| $2L_{p-2S}$ = 460 nm |

Figure 14B:
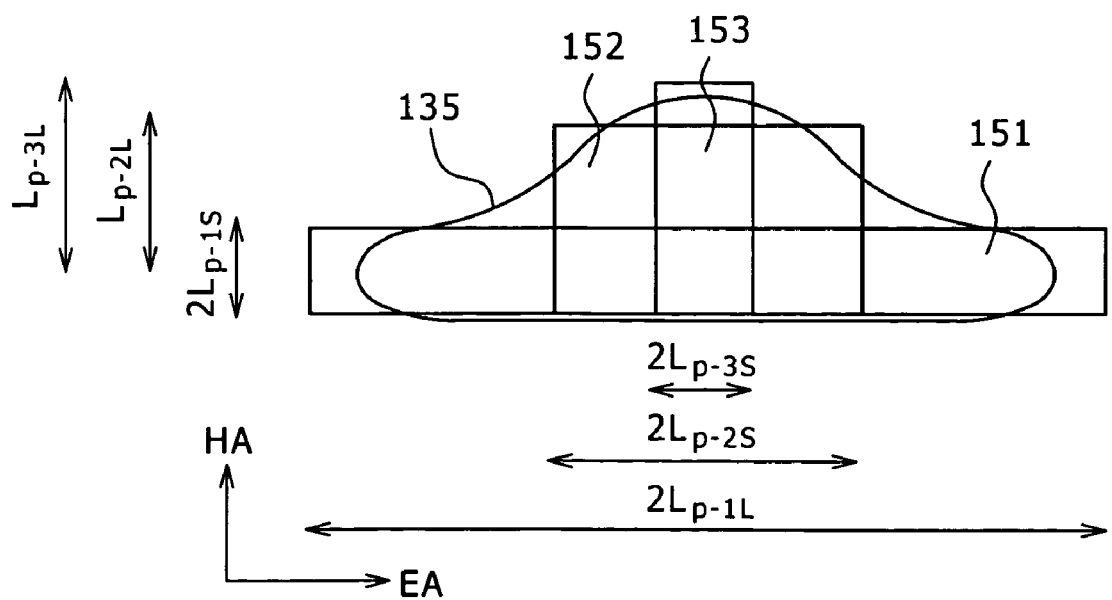

Incidentally, the number of the second shape(s) is not limited to one. FIG. 14B shows an example in which the number of the second shape(s) is two.

In this example, a second shape 152 assumes a polygon (more specifically, a rectangle) of which the length along the second shape axis substantially parallel to the hard axis (HA) is $L_{p-2L}$ [where $L_{p-1S}<L_{p-2L}<L_{p-1L}$] and the length along the direction passing through the center of the first shape 151 and being perpendicular to the second shape axis is $2L_{p-2S}$ [where $L_{p-2S}<L_{p-1L}$]. In addition, another second shape 153 assumes a polygon (more specifically, a rectangle) of which the length along the second shape axis substantially parallel to the hard axis (HA) is $L_{p-3L}$ [where $L_{p-2L}<L_{p-3L}<L_{p-1L}$] and the length along the direction passing through the center of the first shape 151 and being perpendicular to the second shape axis is $L_{p-3S}$ [where $L_{p-3S}<L_{p-2S}$].

Here, the values of $2L_{p-1L}$, $2L_{p-1S}$, $L_{p-2L}$, $2L_{p-2S}$, $L_{p-3L}$, and $2L_{p-3S}$ are as given in Table 19 below. By using such a pattern as this, it is possible to obtain a recording layer 135 having the pseudo-rhombic shape as shown in FIG. 14B. Incidentally, the size data of the recording layer 135 are approximate to the values shown in Table 14.

TABLE 19

| |
|---|
| $2L_{p-1L}$ = 1200 nm |
| $2L_{p-1S}$ = 300 nm |
| $L_{p-2L}$ = 310 nm |
| $2L_{p-2S}$ = 460 nm |
| $L_{p-3L}$ = 450 nm |
| $2L_{p-3S}$ = 200 nm |

Figure 15:
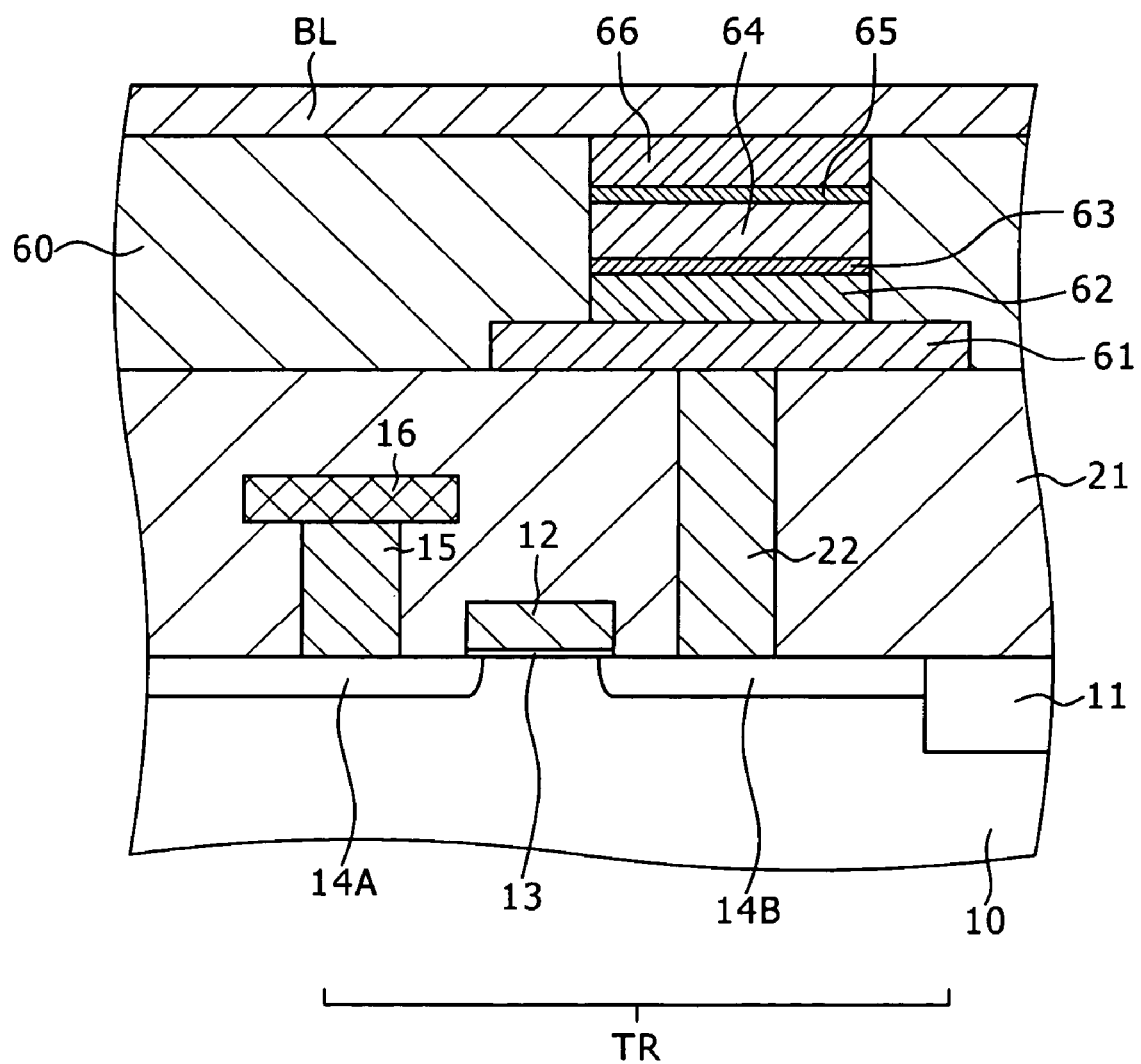
FIG. 15 is a schematic partly sectional view of a magnetoresistance device applying inversion of magnetization by spin implantation.

While the present invention has been described above referring to the preferred examples, the invention is not limited to these examples. The plan-view shapes of the recording layer, the materials constituting the layers of the magnetoresistance device, the methods of forming the layers, the structure of the MRAM and the like described in the examples above are mere examples and may be modified as required. Examples of the magnetoresistance device in the nonvolatile magnetic memory device includes not only the tunnel magnetoresistance device using the TMR effect described in the above examples but also a magnetoresistance device applying the inversion of magnetization by ion implantation, of which a schematic partly sectional view is shown in FIG. 15.

This magnetoresistance device has a structure in which a combined spin filter and reference layer 62, a tunnel insulation film 63, a recording layer 64, a metallic spacer layer 65, and a spin filter layer 66 are laminated on a lower electrode 61 formed on an insulation layer 60. The same selection transistor TR as that shown in FIG. 6 is provided on a semiconductor substrate 10, and a source/drain region 14B on one side of the selection transistor TR is connected to the lower electrode 61 through a contact hole 22 composed of a tungsten plug.

Figure 16:
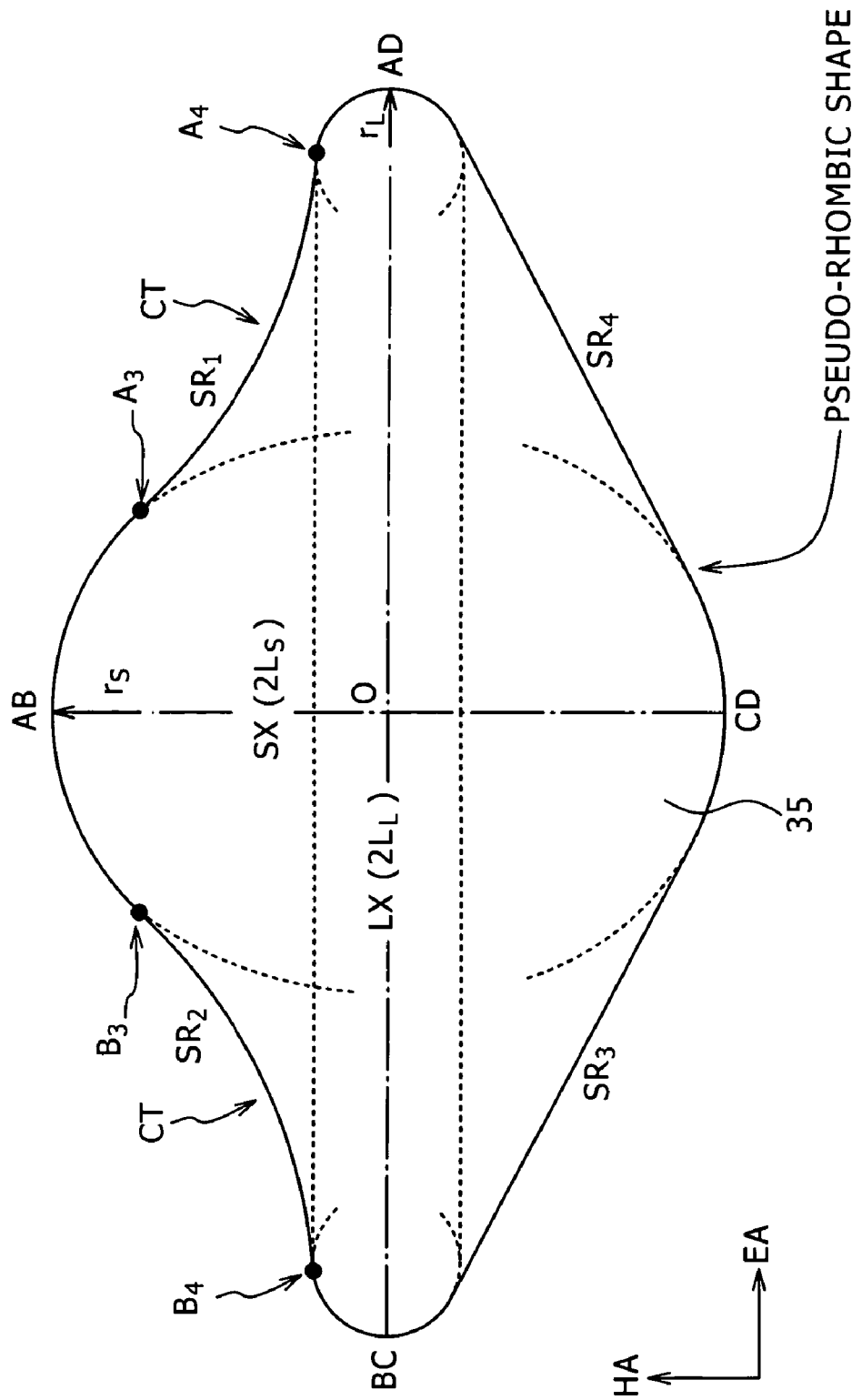
FIG. 16 is a schematic plan view of a modified example of the recording layer in the nonvolatile magnetic memory device in Example 1.

In addition, while a configuration in which the four sides $SR_m$ each include a smooth curve having a central portion thereof curved toward the center of the pseudo-rhombic shape has been used in Example 1, an alternative configuration may be adopted in which the two sides $SR_1$ and $SR_2$ each include a smooth curve having a central portion thereof curved toward the center of the pseudo-rhombic shape. The plan-view shape of such a recording layer as this is shown in FIG. 16. In this example, when the pseudo-rhombic shape is divided into two regions by the longer axis LX of the pseudo-rhombic shape, the two sides $SR_1$ and $SR_2$ each including a smooth curve having a central portion thereof curved belong to one of the two regions. In addition, the plan-view shape of the recording layer 35 is substantially line symmetric with respect to the shorter axis SX of the pseudo-rhombic shape.

Figure 17:
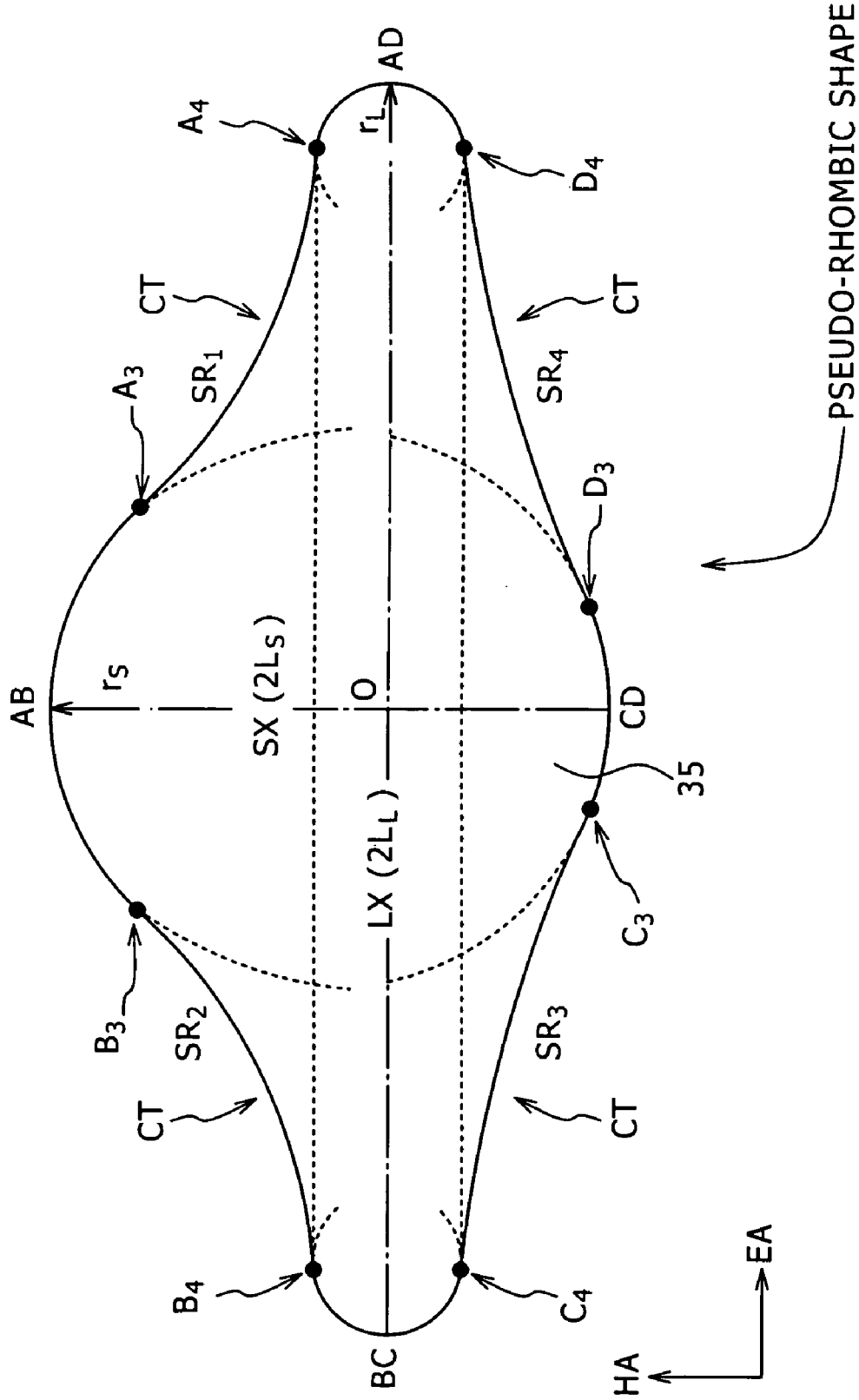
FIG. 17 is a schematic plan view of another modified example of the recording layer in the nonvolatile magnetic memory device in Example 1.

Besides, while a configuration in which the four sides $SR_m$ each include a smooth curve having a central portion thereof curved toward the center of the pseudo-rhombic shape, the plan-view shape of the recording layer 35 is substantially line symmetric with respect to the shorter axis SX of the pseudo-rhombic shape, and is substantially line symmetric with respect also to the longer axis LX of the pseudo-rhombic shape has been adopted in Example 1 above, a configuration may be adopted in which the plan-view shape of the recording layer 35 is substantially line symmetric with respect only to the shorter axis SX of the pseudo-rhombic shape. The plan-view shape of such a recording layer as this is shown in FIG. 17.

Figure 18A:
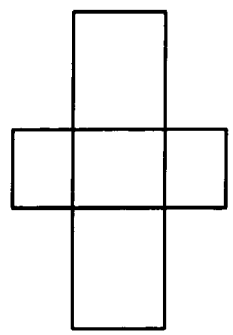
FIGS. 18A to 18E show patterns obtained upon optical proximity corrections.
Figure 18B:
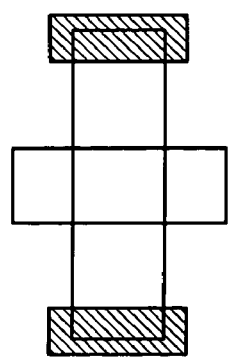
Figure 18C:
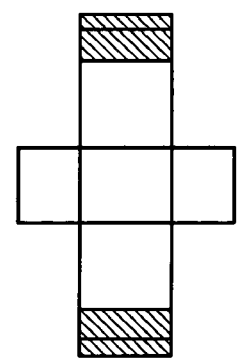
Figure 18D:
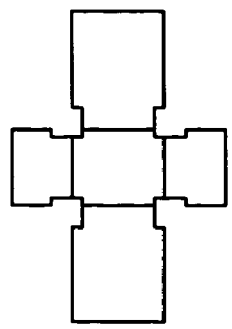
Figure 18E:
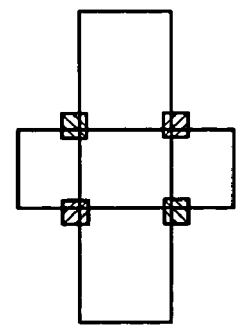
Figure 19:
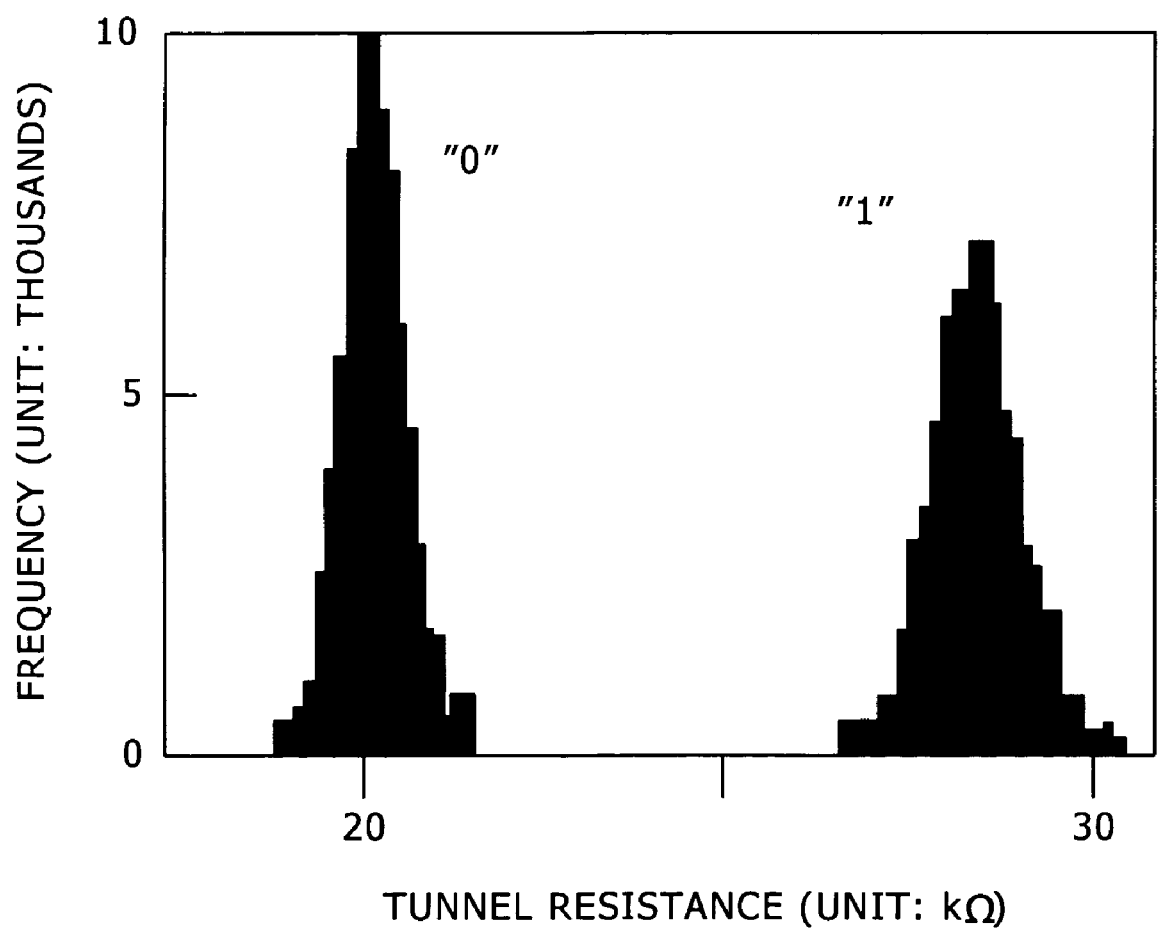
FIG. 19 is a diagram showing an example of the distribution of resistance of the recording layer constituting a TMR type nonvolatile magnetic memory device.
Figure 20:
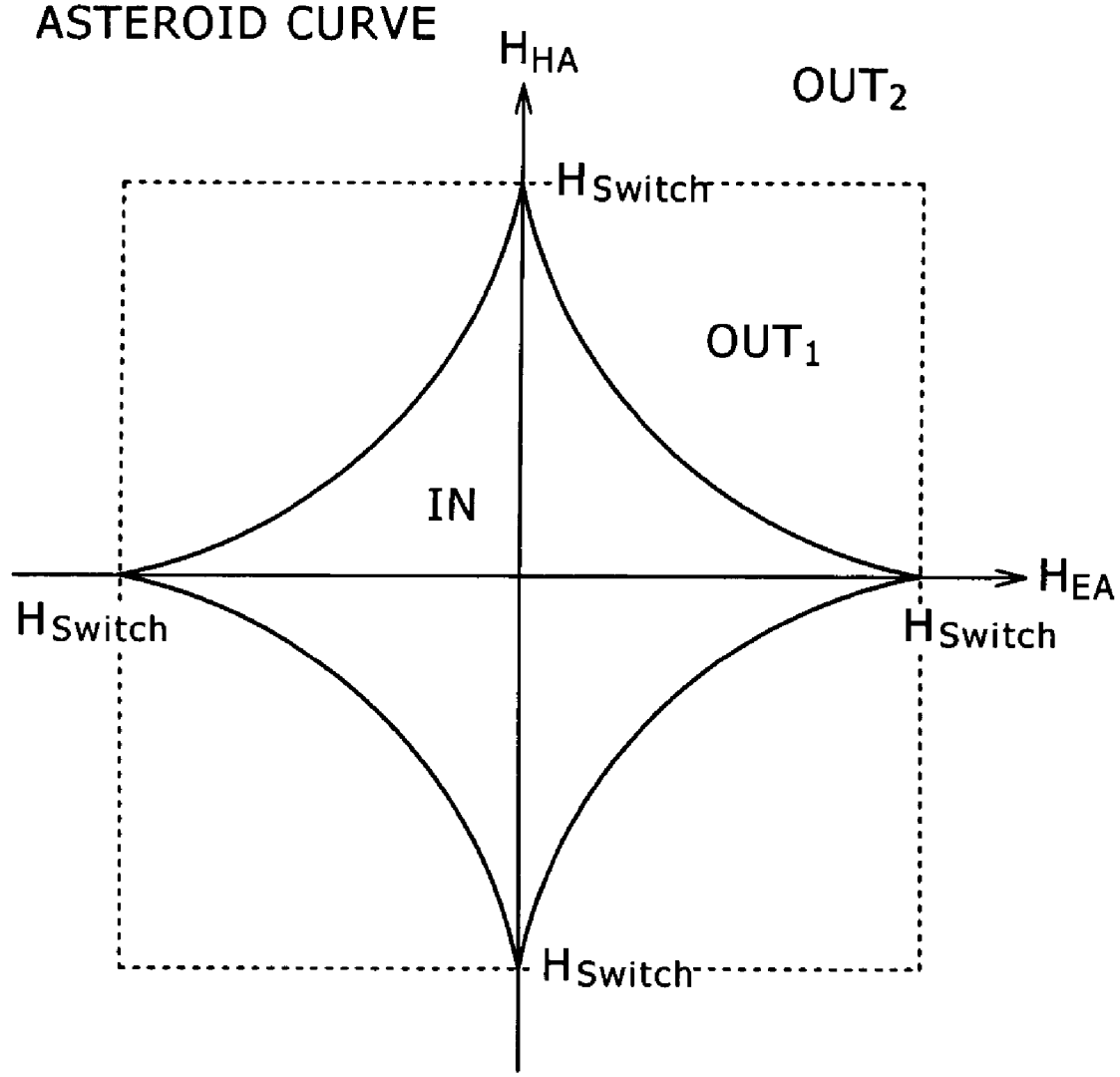
FIG. 20 is a diagram schematically showing an asteroid curve in the TMR type nonvolatile magnetic memory device.
Figure 21:
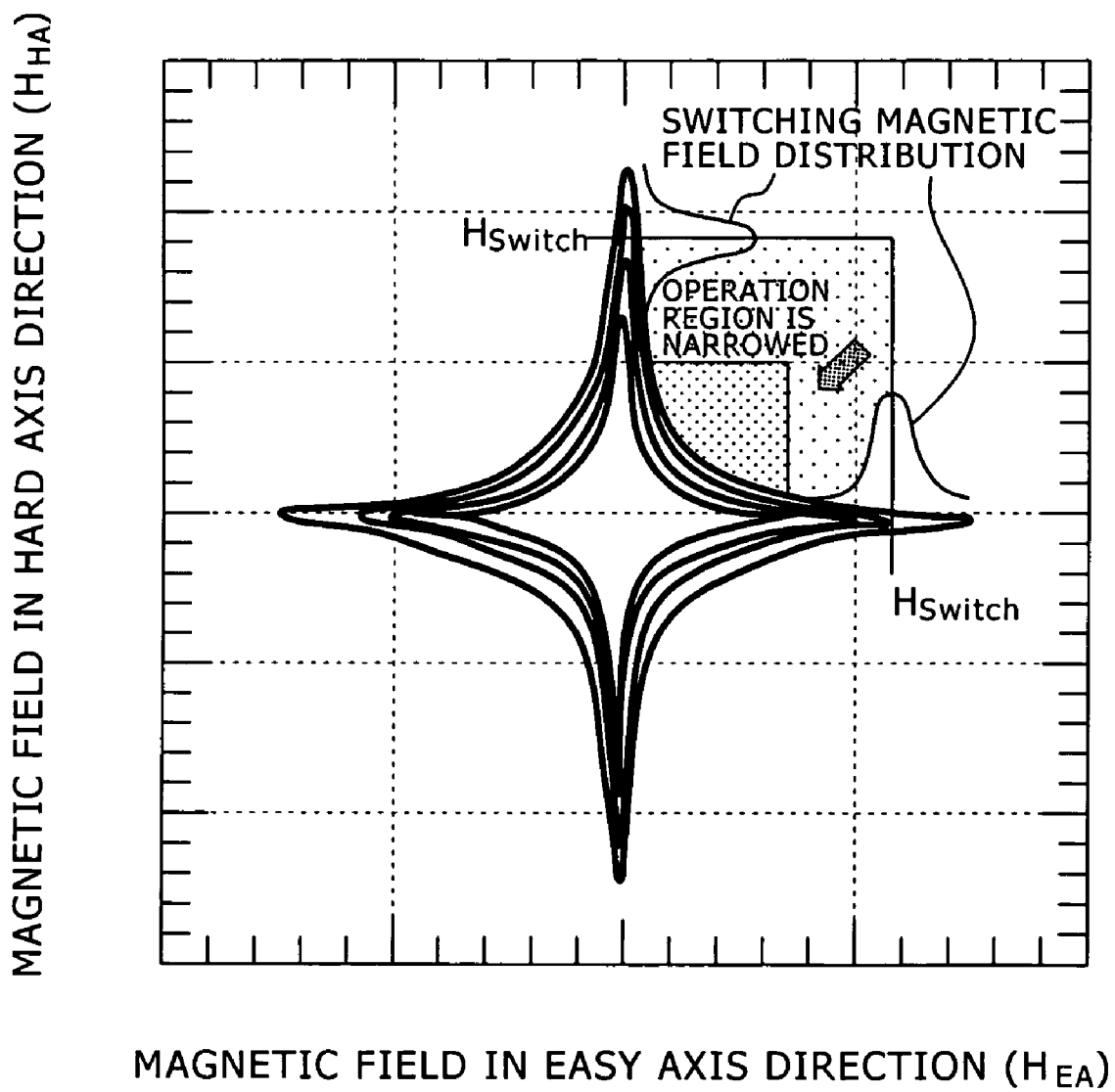
FIG. 21 is a diagram schematically showing the dispersion of switching magnetic field ($H_{Switch}$) of the asteroid curve in the TMR type nonvolatile magnetic memory device.
Figure 22A:
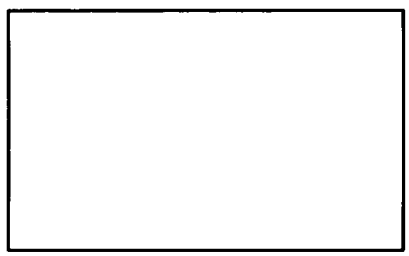
FIGS. 22A to 22F schematically show the plan-view shapes of tunnel magnetoresistance devices in TMR type nonvolatile magnetic memory devices according to the related art.
Figure 22B:
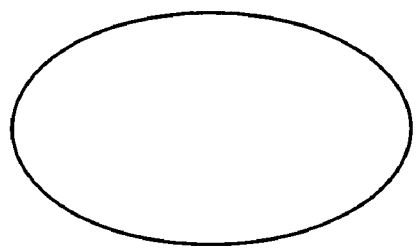
Figure 22C:
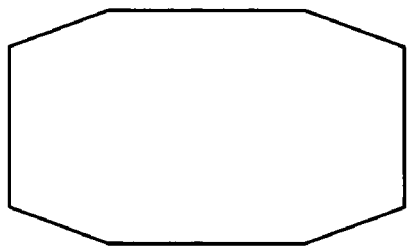
Figure 22D:
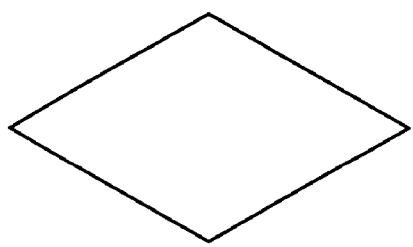
Figure 22E:
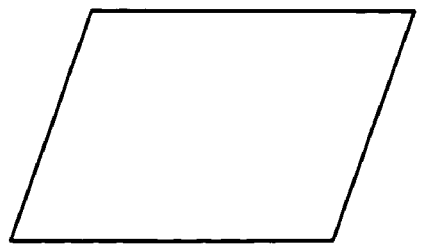
Figure 22F:
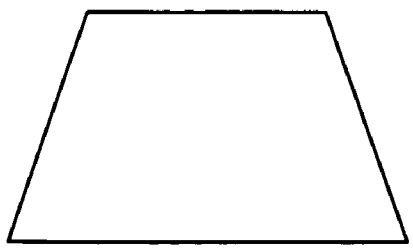

The pattern constituting the photomask described in Examples 3 and 4 may be subjected to a optical proximity correction. Examples of application of hammer head correction, wiring end wearout correction, inner serif correction, and outer serif correction to the pattern (see FIG. 18A) shown in Example 3 are exemplified in FIGS. 18B, 18C, 18D, and 18E, respectively. Incidentally, in FIGS. 18B, 18C, and 18E, the locations of correction are hatched.

Examples of the data writing system include not only the direct mode in which a unidirectional current is passed to the write word line RWL and a positive-direction or negative-direction current is passed to the bit line depending on the data to be written, but also the toggle mode described in U.S. Pat. Nos. 6,545,906 B1 and 6,633,498 B1. Here, the toggle mode is a system in which a unidirectional current is passed to the write word line RWL, a unidirectional current is passed also to the bit line independently of the data to be written, and data is written into the magnetoresistance device only when the data recorded in the magnetoresistance device is different from the data to be written.

The data reading can be carried out by use of the data read line, without using the bit line. In this case, the bit line is formed on the upper side of the recording layer (the second ferromagnetic material layer) in the state of being electrically insulated from the recording layer (the second ferromagnetic material layer) by the upper interlayer insulation layer. Then, the data read line electrically connected to the recording layer (the second ferromagnetic material layer) may be provided separately.

What is claimed is:

1. A nonvolatile magnetic memory device comprising;
a magnetoresistance device having a recording layer formed of a ferromagnetic material for storing information by use of variation in resistance depending on the magnetization inversion state;
wherein,
a plan-view shape of said recording layer is a pseudo-rhombic shape,
two of the four sides constituting said pseudo-rhombic shape each include a smooth curve having a central portion curved toward the center of said pseudo-rhombic shape,
the easy axis of magnetization of said recording layer is substantially parallel to the longer axis of said pseudo-rhombic shape,
the hard axis of magnetization of said recording layer is substantially parallel to the shorter axis of said pseudo-rhombic shape,
the sides constituting the plan-view shape of said recording layer are smoothly connected to each other, and
the plan-view shape of said recording layer is substantially line symmetric with respect to the shorter axis of the pseudo-rhombic shape, but not with respect to the longer axis of said pseudo-rhombic shape.

2. The nonvolatile magnetic memory device as set forth in claim 1, wherein there are at least two points of inflection in each of said sides each including said smooth curve having the central portion curved.

3. The nonvolatile magnetic memory device as set forth in claim 1, wherein when said pseudo-rhombic shape is divided into two regions by the longer axis of said pseudo-rhombic shape, said two sides each including said smooth curve having the central portion curved belong to one of said regions.

4. The nonvolatile magnetic memory device as set forth in claim 1, wherein two of said four sides each include a smooth curve having a central portion curved toward the center of said pseudo-rhombic shape or a substantially straight line.

5. The nonvolatile magnetic memory device as set forth in claim 1, wherein said plan-view shape of said recording layer is substantially line symmetric with respect to the shorter axis of said pseudo-rhombic shape.

* * * * *